(12) United States Patent
Misaki

(10) Patent No.: US 10,804,314 B2
(45) Date of Patent: Oct. 13, 2020

(54) IMAGING PANEL AND METHOD FOR PRODUCING SAME

(71) Applicant: Sharp Kabushiki Kaisha, Sakai, Osaka (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/333,284

(22) PCT Filed: Sep. 19, 2017

(86) PCT No.: PCT/JP2017/033682
§ 371 (c)(1),
(2) Date: Mar. 14, 2019

(87) PCT Pub. No.: WO2018/056255
PCT Pub. Date: Mar. 29, 2018

(65) Prior Publication Data
US 2019/0245002 A1     Aug. 8, 2019

(30) Foreign Application Priority Data
Sep. 21, 2016   (JP) ................................ 2016-184227

(51) Int. Cl.
*H01L 27/146*   (2006.01)
*G01T 1/20*     (2006.01)
(Continued)

(52) U.S. Cl.
CPC .......... *H01L 27/14663* (2013.01); *G01T 1/20* (2013.01); *G01T 1/2018* (2013.01);
(Continued)

(58) Field of Classification Search
CPC ......... H01L 27/14663; H01L 27/14612; H01L 27/144; H01L 27/146; H01L 27/14685;
(Continued)

(56) References Cited

U.S. PATENT DOCUMENTS 9,277,896 B2 *   3/2016   Ofuji ................. H01L 27/14663
9,331,119 B2 *   5/2016   Fujiyoshi .......... H01L 27/14683
(Continued)

FOREIGN PATENT DOCUMENTS

JP   2001-077402 A   3/2001
JP   2006-073611 A   3/2006
(Continued)

OTHER PUBLICATIONS

Official Communication issued in International Patent Application No. PCT/JP2017/033682, dated Dec. 5, 2017.

*Primary Examiner* — David P Porta
*Assistant Examiner* — Fani Boosalis
(74) *Attorney, Agent, or Firm* — Keating & Bennett, LLP

(57) ABSTRACT

Provided is an X-ray imaging panel in which off-leakage current can be decreased, and a method for producing the same. An imaging panel includes a photodiode that includes a lower electrode, a photoelectric conversion layer 15 provided on the lower electrode, and an upper electrode 14*b* provided on the photoelectric conversion layer 15. The photoelectric conversion layer 15 includes a first amorphous semiconductor layer 151, an intrinsic amorphous semiconductor layer 152, and a second amorphous semiconductor layer 153. In the photoelectric conversion layer 15, an upper end portion 1531 of the second amorphous semiconductor layer 153 has a protrusion portion 15*a* that protrudes toward an outer side of the photoelectric conversion layer 15 with respect to an upper end portion 1521 of the intrinsic amorphous semiconductor layer 152.

4 Claims, 22 Drawing Sheets

(51) Int. Cl.
  *H01L 27/144* (2006.01)
  *H04N 5/32* (2006.01)
  *H04N 5/374* (2011.01)

(52) U.S. Cl.
  CPC .......... *H01L 27/144* (2013.01); *H01L 27/146* (2013.01); *H01L 27/14612* (2013.01); *H01L 27/14689* (2013.01); *H01L 27/14692* (2013.01); *H01L 27/14698* (2013.01); *H04N 5/32* (2013.01); *H04N 5/374* (2013.01)

(58) Field of Classification Search
  CPC .......... G01T 1/2018; G01T 1/20; H04N 5/32; H04N 5/374
  See application file for complete search history.

(56) References Cited

U.S. PATENT DOCUMENTS

| | | |
|---|---|---|
| 2010/0059804 A1 | 3/2010 | Hayashi et al. |
| 2012/0305785 A1 | 12/2012 | Fujiyoshi et al. |

FOREIGN PATENT DOCUMENTS

| | | |
|---|---|---|
| JP | 2007-165865 A | 6/2007 |
| JP | 2010-067762 A | 3/2010 |
| JP | 2011-100753 A | 5/2011 |
| JP | 2013-012697 A | 1/2013 |
| JP | 2015-119113 A | 6/2015 |

* cited by examiner

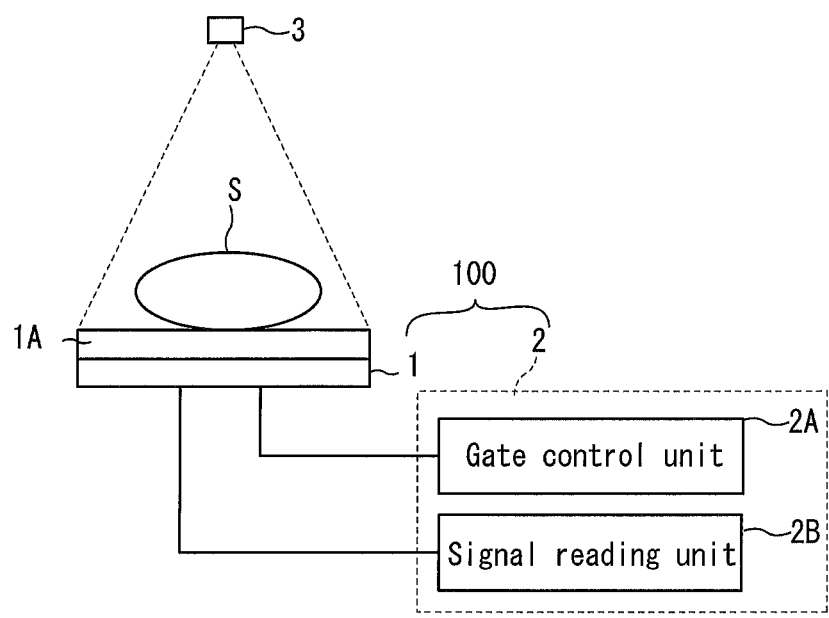
F I G. 1

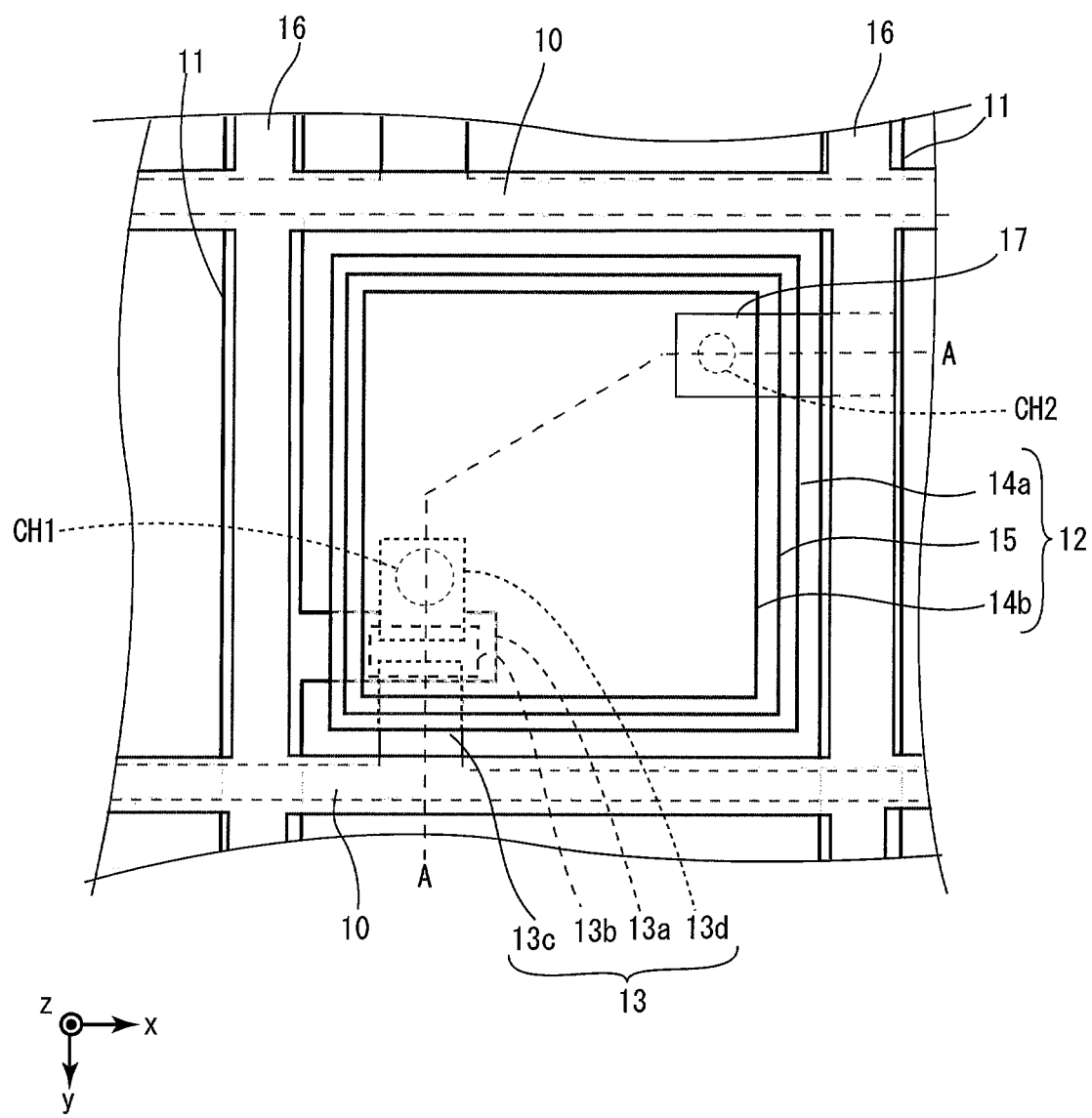
F I G. 3

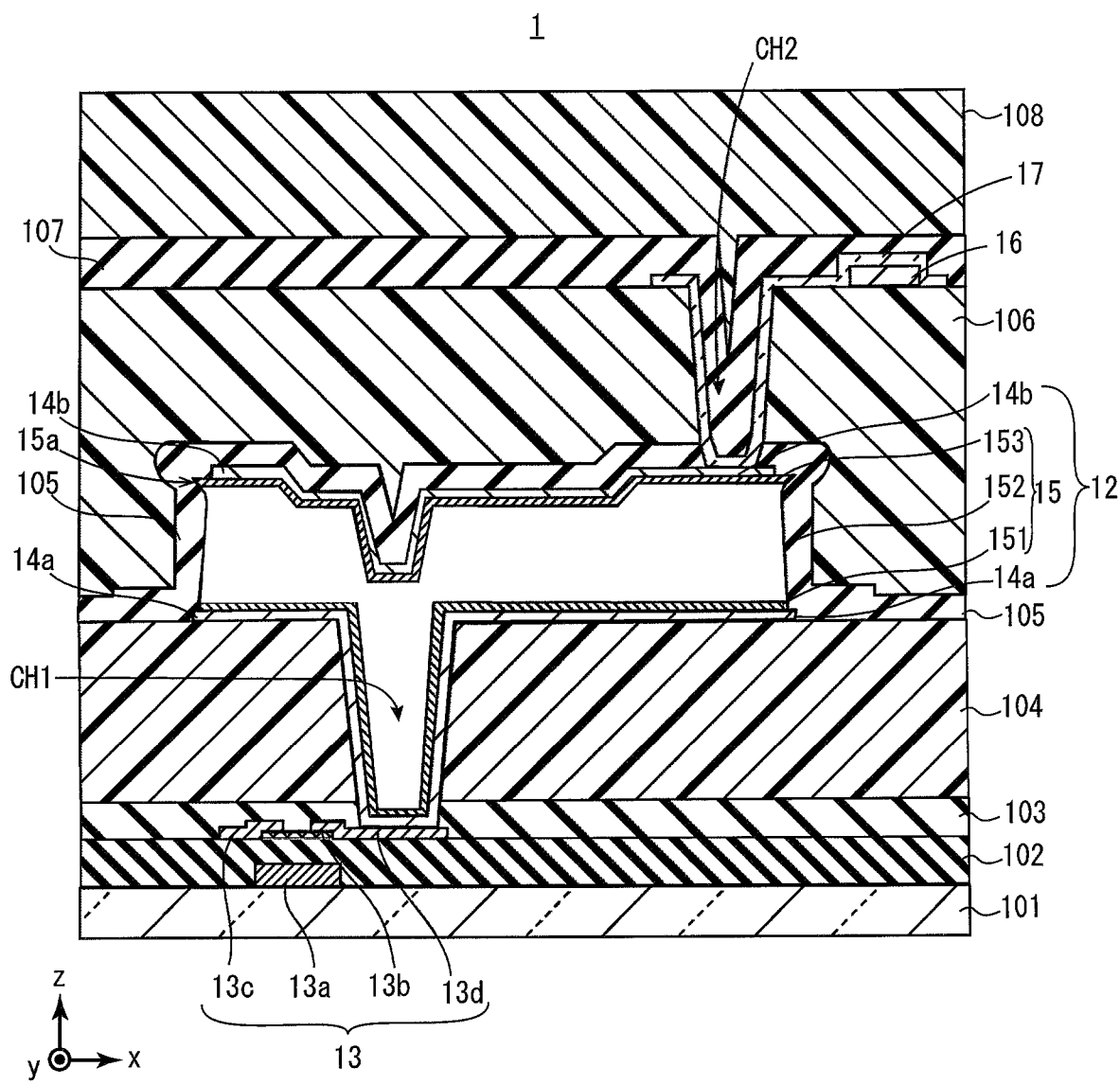
F I G. 4 A

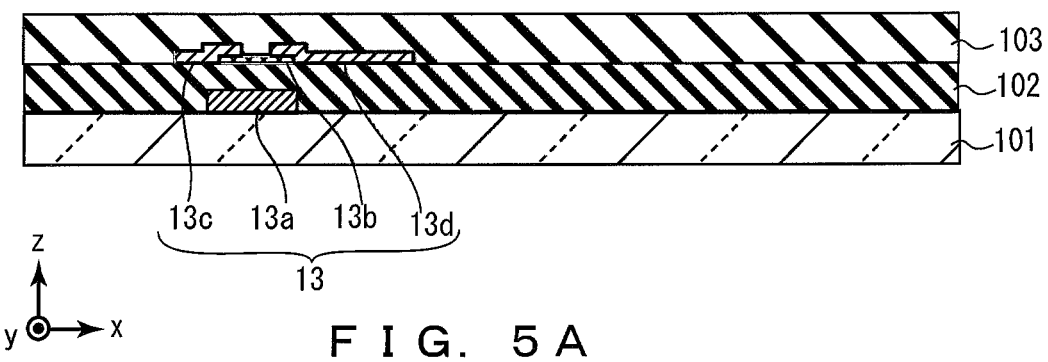
F I G. 5A
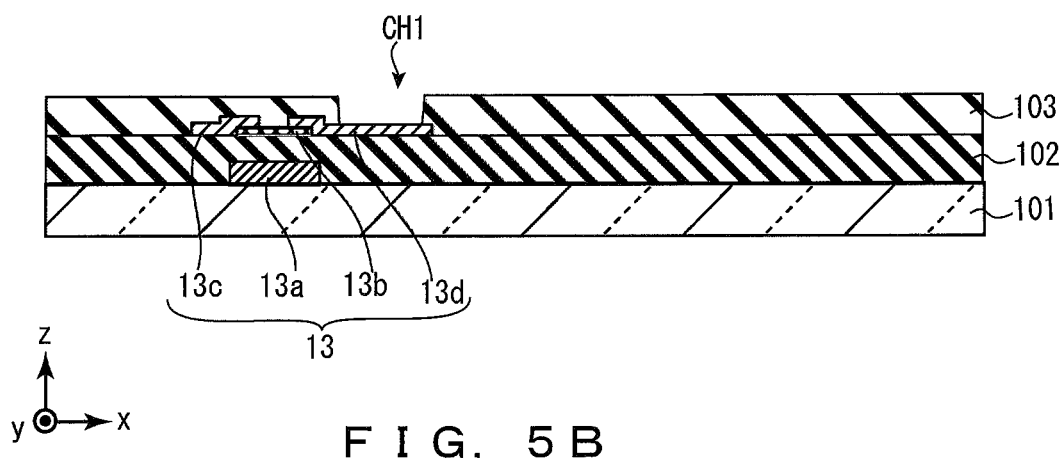
F I G. 5B
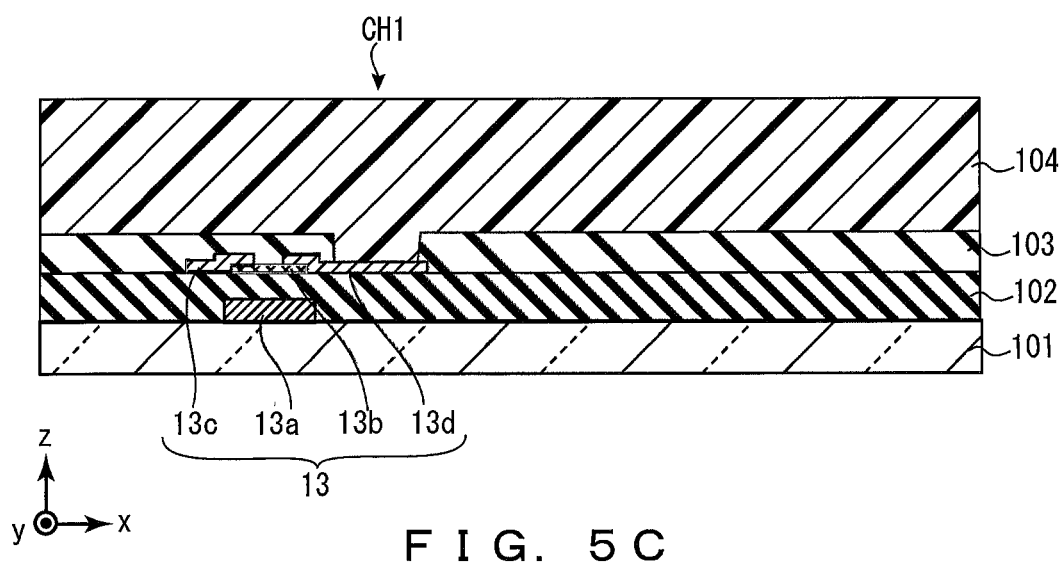
F I G. 5C

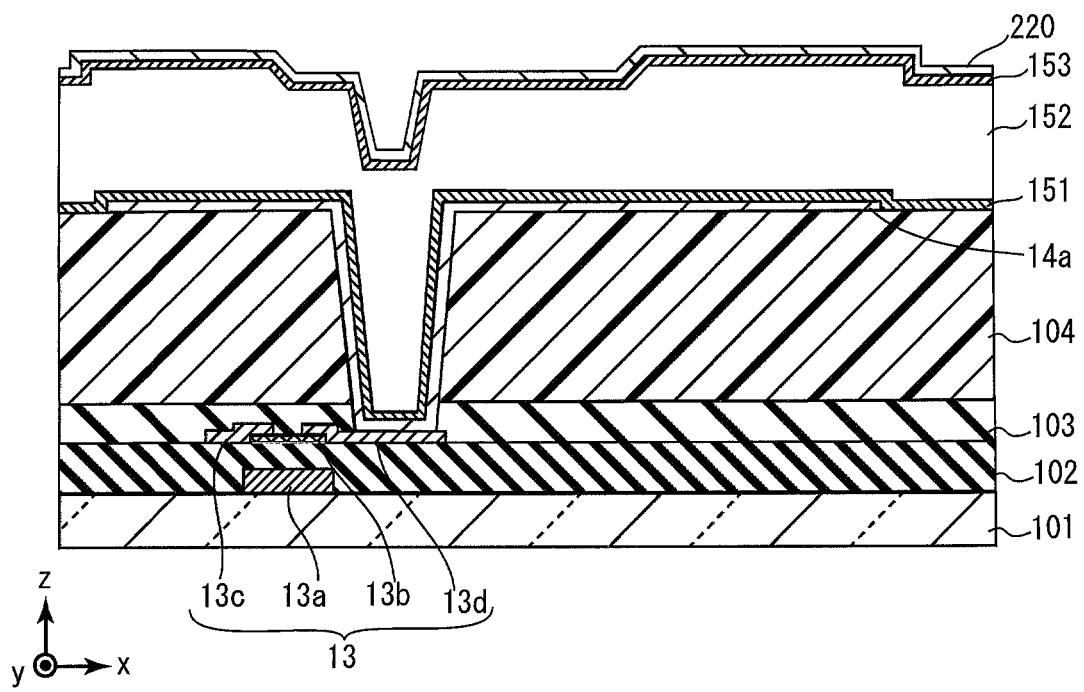
F I G. 5G
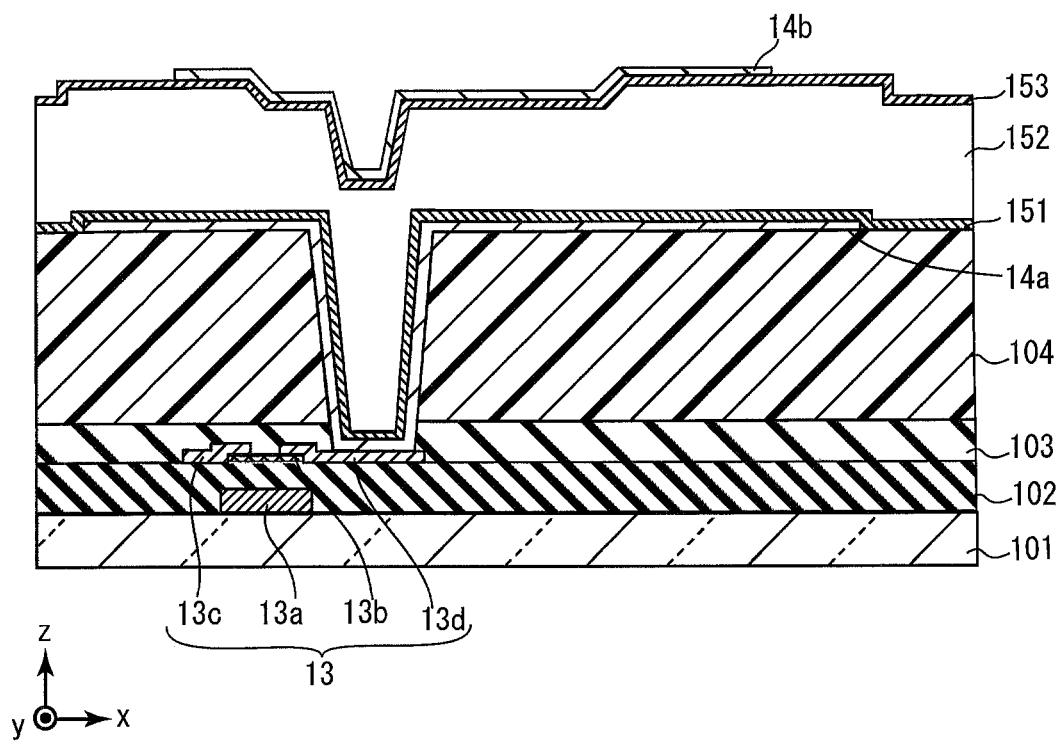
F I G. 5H

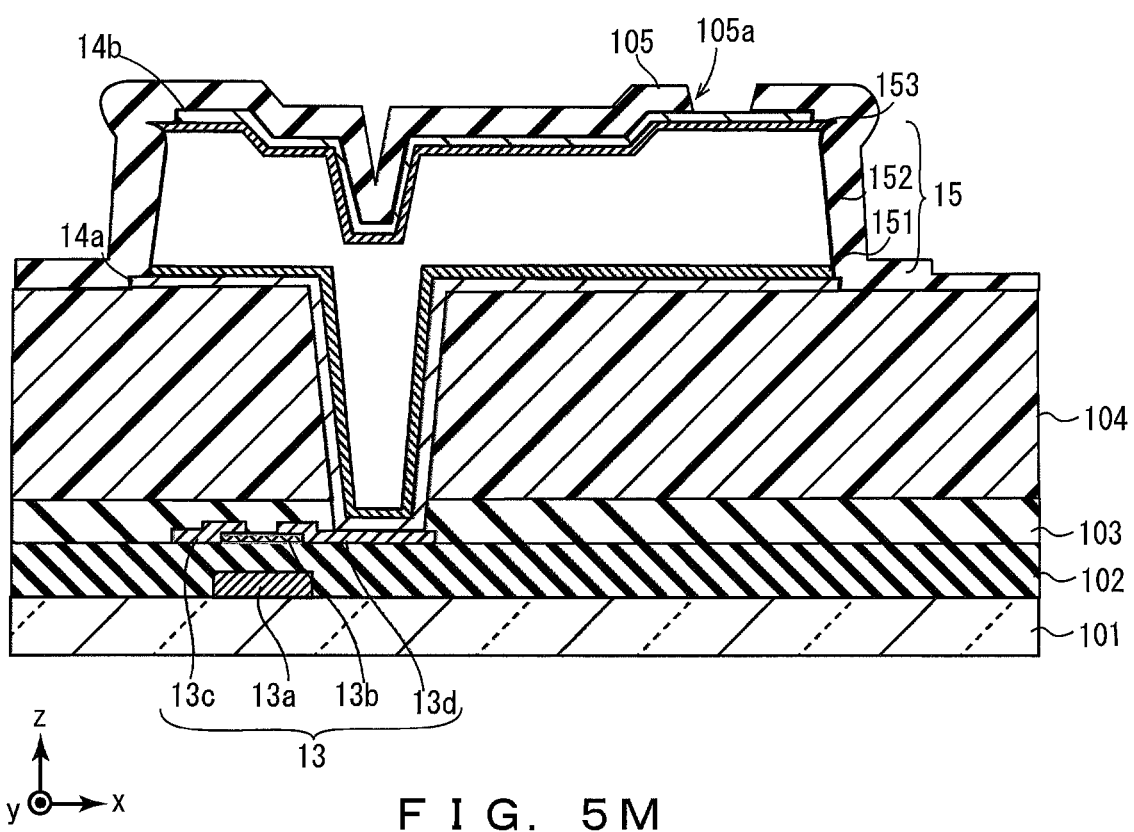
F I G. 5M

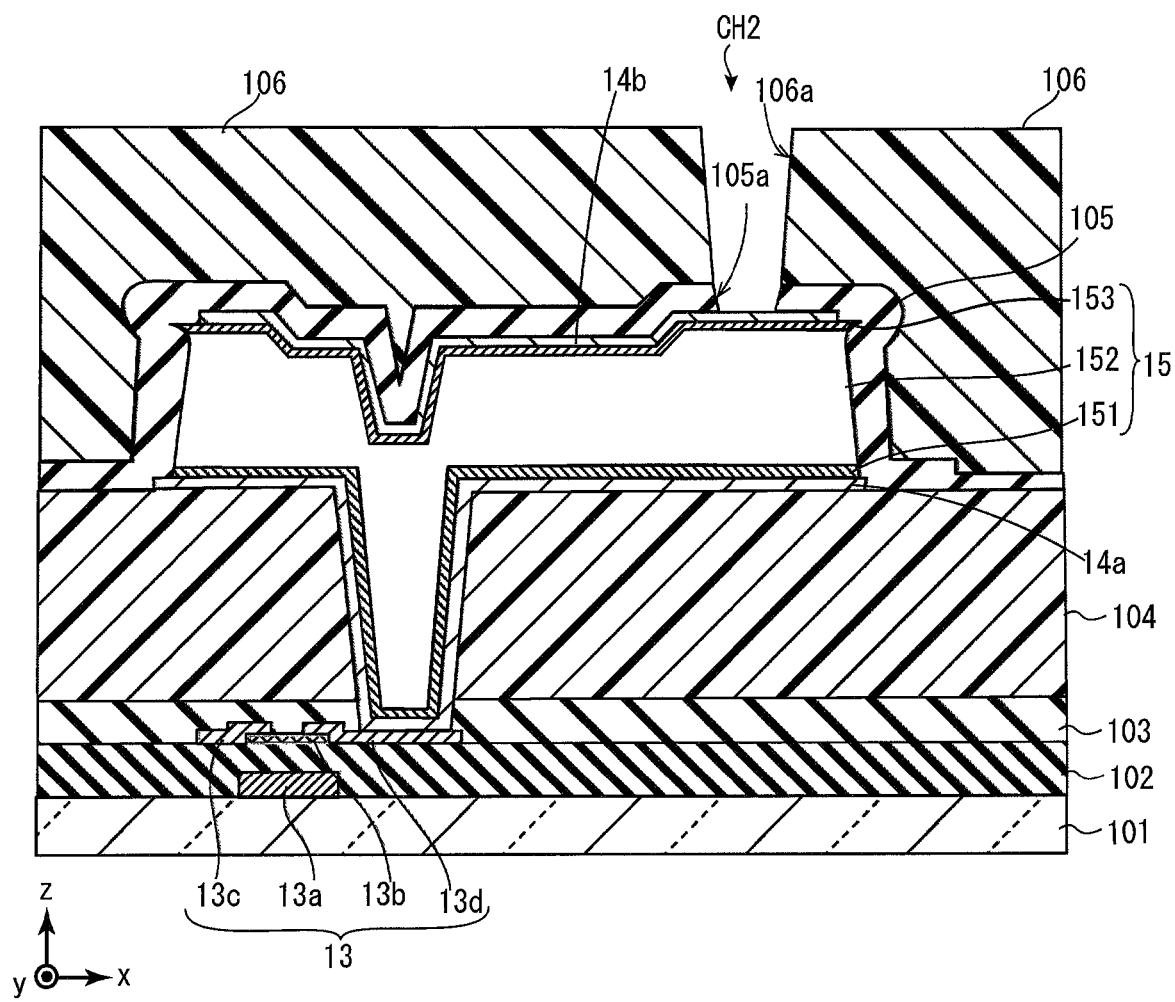
F I G. 5 N

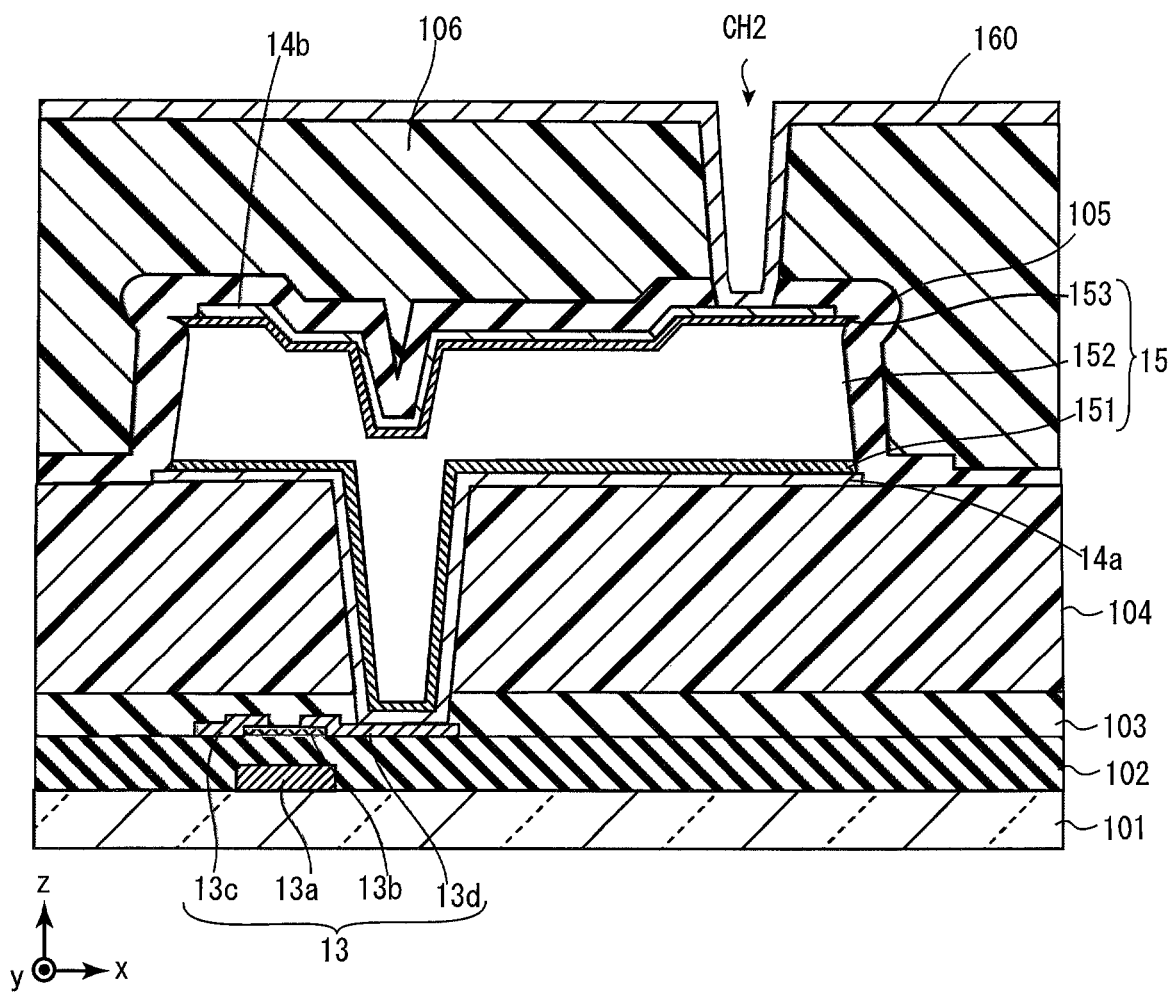
F I G. 50

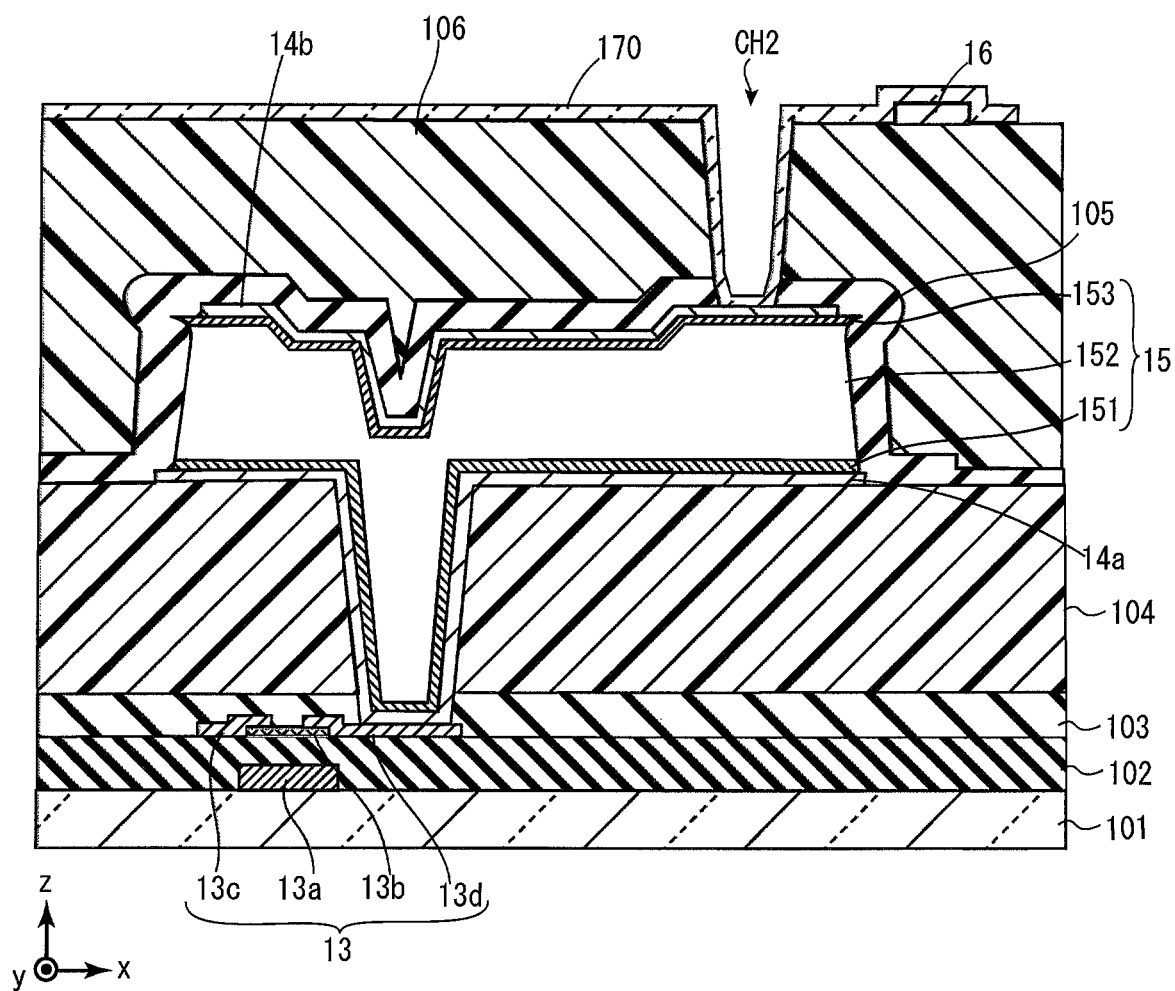
F I G. 5 Q

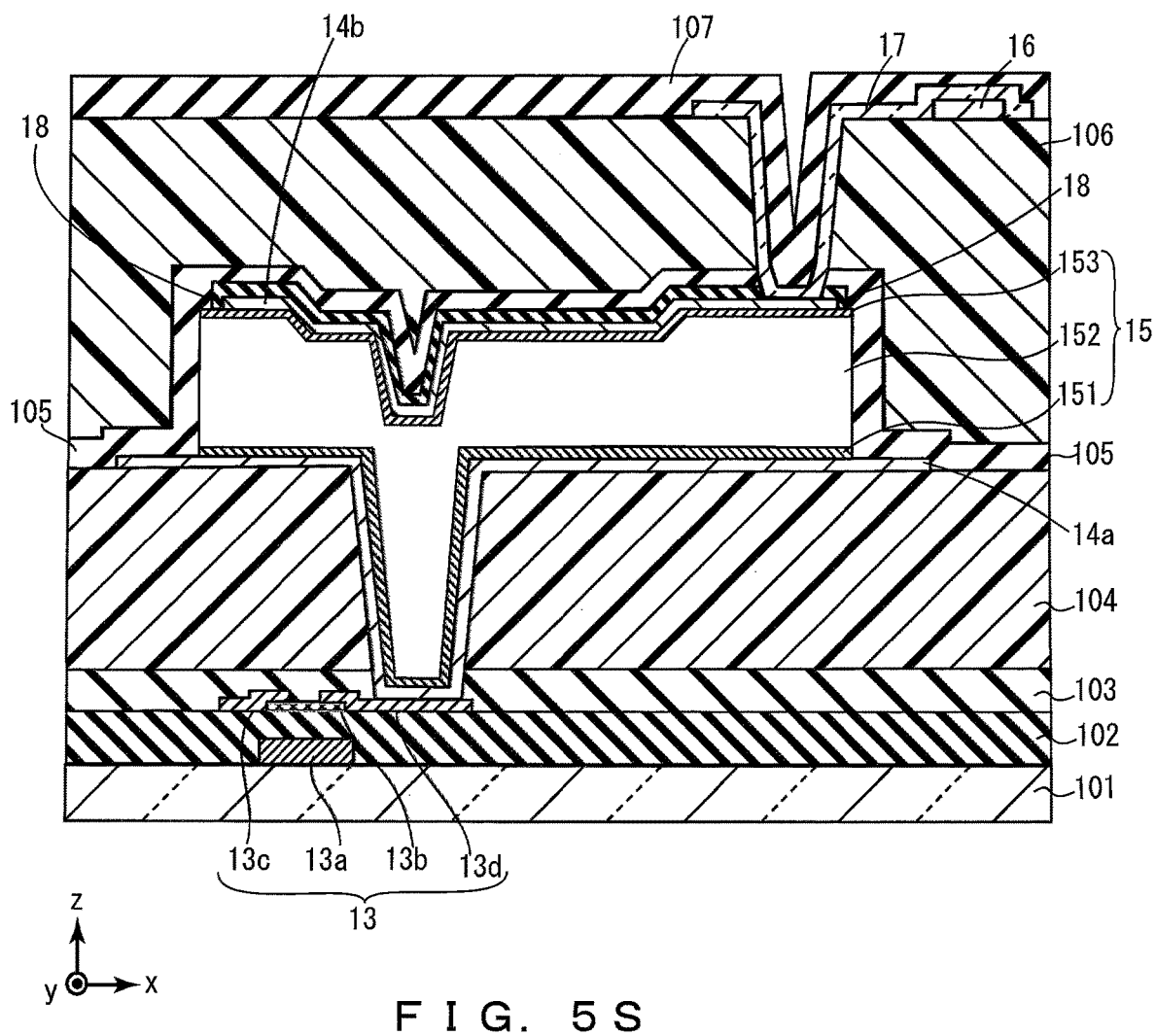
F I G. 5 S

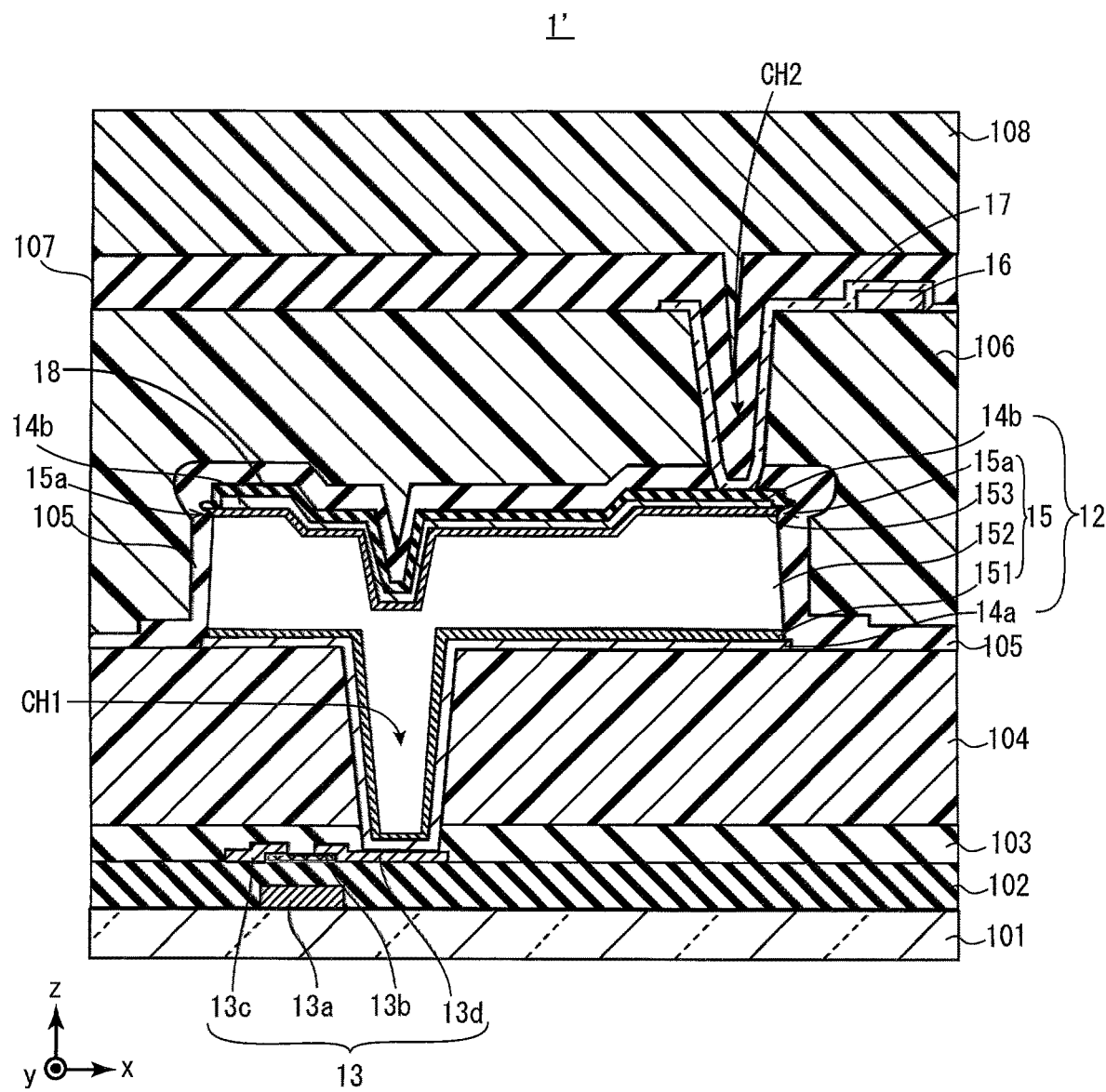
F I G. 6

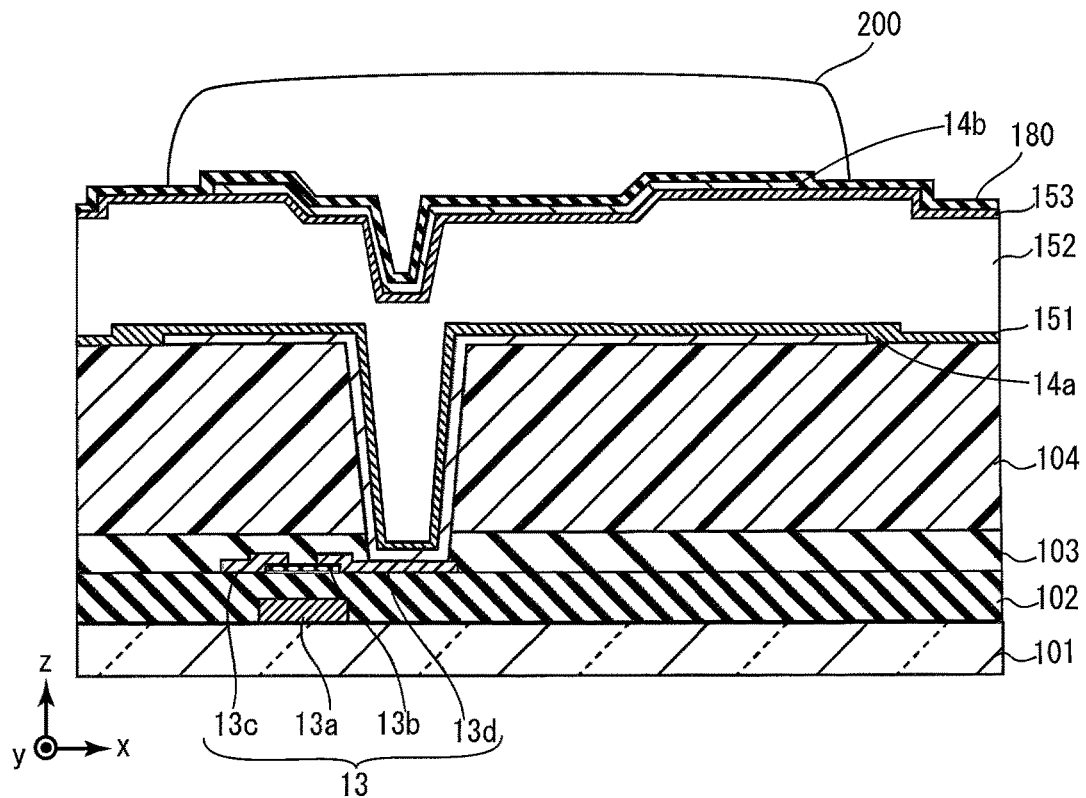
F I G. 7 A
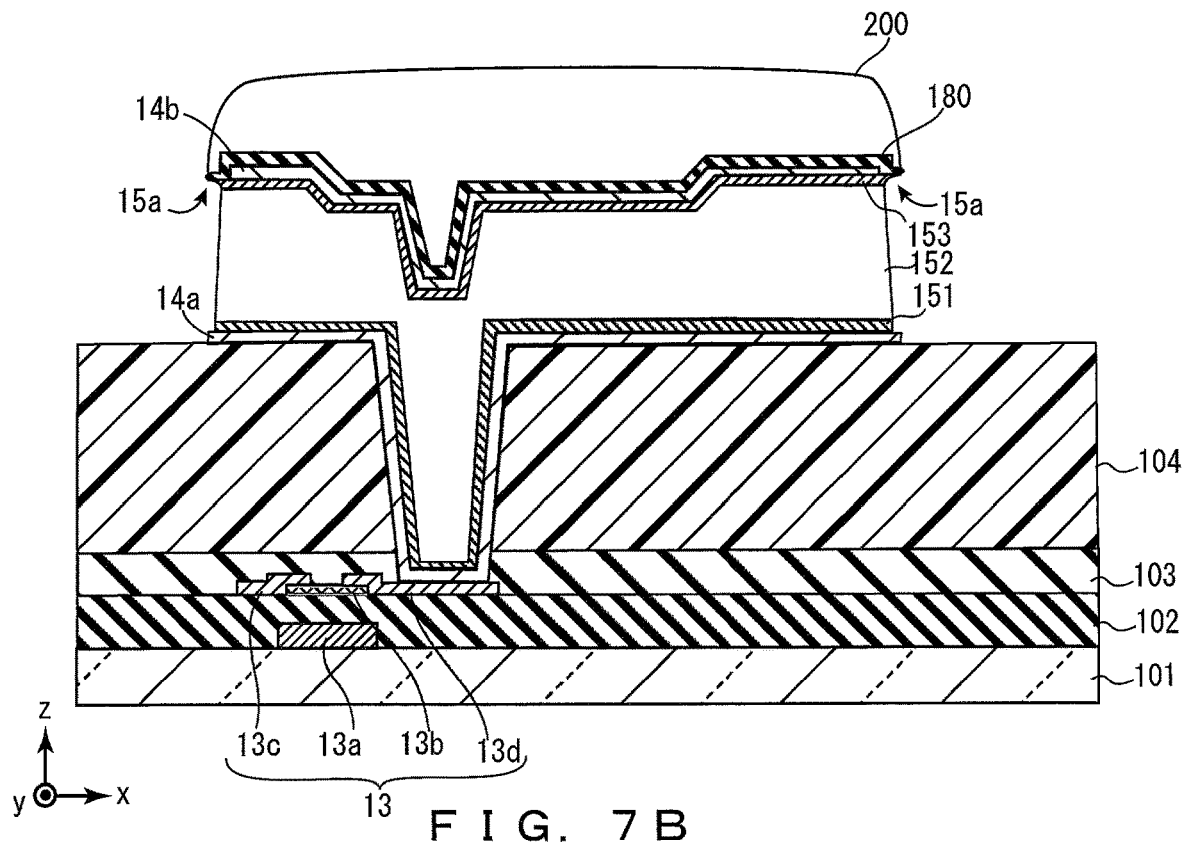
F I G. 7 B

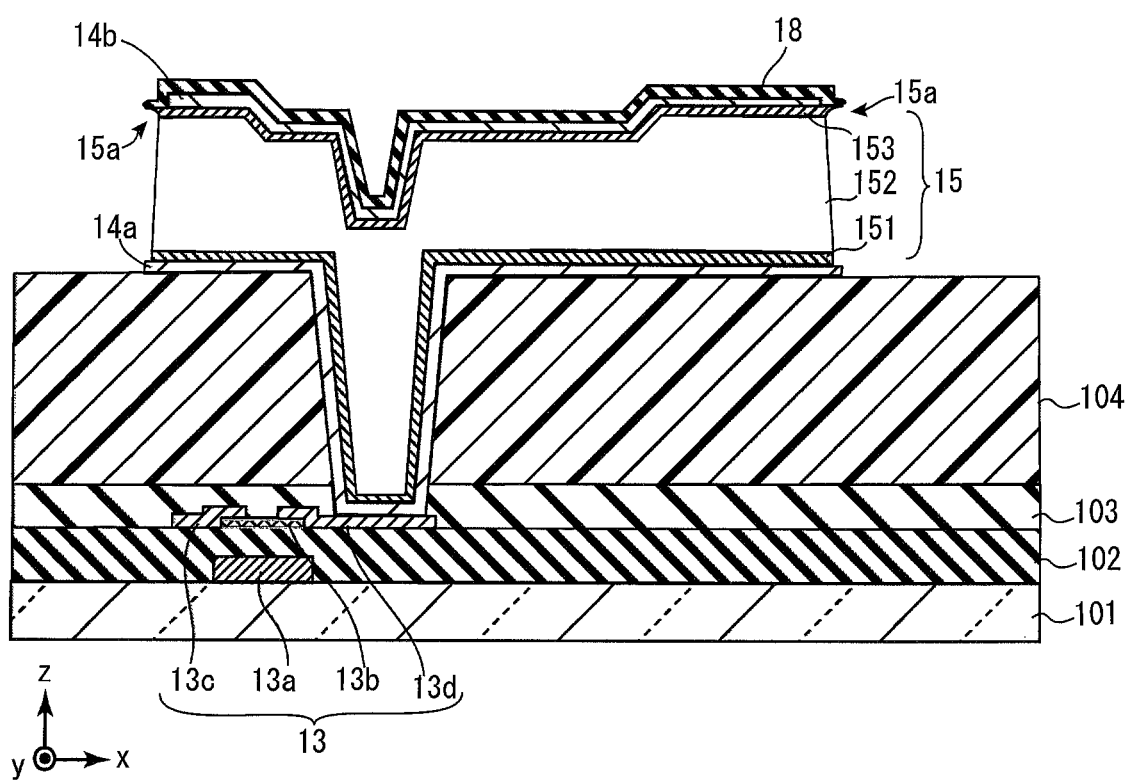
F I G. 7 C

IMAGING PANEL AND METHOD FOR PRODUCING SAME

TECHNICAL FIELD

The present invention relates to an imaging panel and a method for producing the same.

BACKGROUND ART

An X-ray imaging device that picks up an X-ray image with an imaging panel that includes a plurality of pixel portions is known. In such an X-ray imaging device, for example, p-intrinsic-n (PIN) photodiodes are used as photoelectric conversion elements, and irradiated X-rays are converted into charges by the PIN photodiodes. Converted charges are read out by thin film transistors (hereinafter also referred to as TFTs) that are caused to operate, the TFTs being provided in the pixel portions. With the charges being read out in this way, an X-ray image is obtained. JP-A-2015-119113 discloses a photoelectric conversion element array unit provided with PIN photodiodes.

SUMMARY OF THE INVENTION

Incidentally, in the above-described imaging panel producing process, PIN photodiodes are formed by forming an n-type amorphous semiconductor layer, an intrinsic amorphous semiconductor layer, and a p-type amorphous semiconductor layer in this order, applying resist on the p-type amorphous semiconductor layer, and thereafter, dry-etching the same. Plasma damage occurring to side surfaces of the PIN photodiodes due to dry etching causes defects in the interface between the p-type amorphous semiconductor layer and the intrinsic amorphous semiconductor layer, thereby causing off-leakage current to increase in the PIN photodiodes.

It is an object of the present invention to provide an imaging panel in which off-leakage current can be decreased.

An imaging panel of the present invention with which the above-described object is achieved is an imaging panel that generates an image based on scintillation light that is obtained from X-rays transmitted through an object. The imaging panel includes: a substrate having an insulating property; a thin film transistor that is formed on the substrate; an insulating film that covers the thin film transistor; a photoelectric conversion layer that is provided on the insulating film, and converts the scintillation light into charges; an upper electrode that is provided on the photoelectric conversion layer; and a lower electrode that is provided under the photoelectric conversion layer, and is connected with the thin film transistor, wherein the photoelectric conversion layer includes: a first amorphous semiconductor layer that is in contact with the insulating film, and has a first conductivity; an intrinsic amorphous semiconductor layer that is in contact with the first amorphous semiconductor layer; and a second amorphous semiconductor layer that is in contact with the intrinsic amorphous semiconductor layer, and has a second conductivity that is opposite to the first conductivity, wherein an upper end portion of the second amorphous semiconductor layer has a protrusion portion that protrudes toward an outer side of the photoelectric conversion layer with respect to an upper end portion of the intrinsic amorphous semiconductor layer.

With the present invention, an imaging panel in which off-leakage current can be decreased can be provided.

BRIEF DESCRIPTION OF DRAWINGS

FIG. 1 schematically shows an X-ray imaging device in an embodiment.

FIG. 3 is an enlarged plan view illustrating one pixel portion of an imaging panel 1 illustrated in FIG. 2.

FIG. 4A is a cross-sectional view of the pixel shown in FIG. 3, taken along the line A-A.

FIG. 5A is a cross-sectional view illustrating a step of forming a first insulating film on a gate insulating film and a TFT formed on a substrate.

FIG. 5B is a cross-sectional view illustrating a step of forming a contact hole CH1 in the first insulating film shown in FIG. 5A.

FIG. 5C is a cross-sectional view illustrating a step of forming a second insulating film on the first insulating film shown in FIG. 5B.

FIG. 5G is a cross-sectional view illustrating a step of forming an n-type amorphous semiconductor layer, an intrinsic amorphous semiconductor layer, and a p-type amorphous semiconductor layer that cover the lower electrode shown in FIG. 5F, and forming a transparent conductive film on the p-type amorphous semiconductor layer.

FIG. 5H is a cross-sectional view illustrating a step of patterning the transparent conductive film shown in FIG. 5G so as to form an upper electrode.

FIG. 5M is a cross-sectional view illustrating a step of forming a contact hole CH2 that passes through the third insulating film shown in FIG. 5L.

FIG. 5N is a cross-sectional view illustrating a step of forming a fourth insulation film on the third insulating film shown in FIG. 5M, and forming an opening in the fourth insulating film, so that the opening is formed on the contact hole CH2.

FIG. 5O is a cross-sectional view illustrating a step of forming a metal film on the fourth insulating film shown in FIG. 5N.

FIG. 5Q is a cross-sectional view illustrating a step of forming a transparent conductive film so that the transparent conductive film covers the bias line shown in FIG. 5P.

FIG. 5S is a cross-sectional view illustrating a step of forming a fifth insulating film so that the fifth insulating film covers the transparent conductive film shown in FIG. 5R.

FIG. 6 is a cross-sectional view illustrating an imaging panel in Embodiment 2.

FIG. 7A is a cross-sectional view illustrating a step in a process for producing the imaging panel shown in FIG. 6, the step being a step of applying resist over an insulating film 180 that will become an upper electrode protection film.

FIG. 7B is a cross-sectional view illustrating a step of patterning the insulating film 180, the n-type amorphous semiconductor layer, the intrinsic amorphous semiconductor layer, and the p-type amorphous semiconductor layer shown in FIG. 7A by dry etching.

FIG. 7C is a cross-sectional view illustrating a state after the resist shown in FIG. 7B is removed.

MODE FOR CARRYING OUT THE INVENTION

Figure 2:
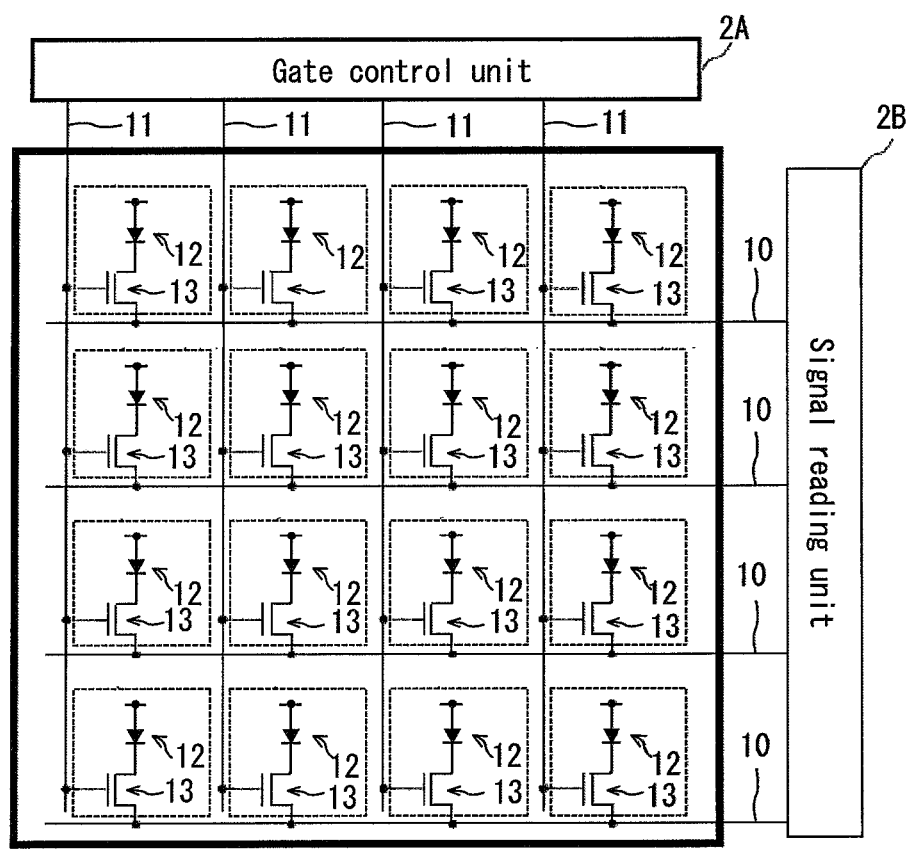
FIG. 2 schematically shows a schematic configuration of the imaging panel illustrated in FIG. 1.

An imaging panel according to one embodiment of the present invention is an imaging panel that generates an image based on scintillation light that is obtained from X-rays transmitted through an object, and the imaging panel includes: a substrate having an insulating property; a thin film transistor that is formed on the substrate; an insulating film that covers the thin film transistor; a photoelectric conversion layer that is provided on the insulating film, and converts the scintillation light into charges; an upper electrode that is provided on the photoelectric conversion layer; and a lower electrode that is provided under the photoelectric conversion layer, and is connected with the thin film transistor, wherein the photoelectric conversion layer includes: a first amorphous semiconductor layer that is in contact with the insulating film, and has a first conductivity; an intrinsic amorphous semiconductor layer that is in contact with the first amorphous semiconductor layer; and a second amorphous semiconductor layer that is in contact with the intrinsic amorphous semiconductor layer, and has a second conductivity that is opposite to the first conductivity, wherein the photoelectric conversion layer has such a protrusion portion that an upper end portion of the second amorphous semiconductor layer protrudes toward an outer side of the photoelectric conversion layer with respect to an upper end portion of the intrinsic amorphous semiconductor layer (the first configuration).

According to the first configuration, the photoelectric conversion layer includes the first amorphous semiconductor layer, the intrinsic amorphous semiconductor layer, and the second amorphous semiconductor layer, and has the protrusion portion. The protrusion portion is such that an upper end portion of the second amorphous semiconductor layer protrudes toward an outer side of the photoelectric conversion layer with respect to an upper end portion of the intrinsic amorphous semiconductor layer. In a case where dry etching is carried out when the photoelectric conversion is formed, the protrusion portion formed on the photoelectric conversion layer makes it unlikely that plasma damage would occur to an interface between the second amorphous semiconductor layer and the intrinsic amorphous semiconductor layer. As a result, off-leakage current of the photoelectric conversion layer can be decreased.

The first configuration may be further characterized by further including an upper electrode protection film that covers the upper electrode on the photoelectric conversion layer, wherein an end portion of the upper electrode is arranged on an inner side of the photoelectric conversion layer with respect to an end portion of the photoelectric conversion layer, and an end portion of the upper electrode protection film is arranged between the end portion of the upper electrode and the end portion of the photoelectric conversion layer (the second configuration).

According to the second configuration, the upper electrode is completely covered with the upper electrode protection film. When resist is removed in a case where the resist is used when the photoelectric conversion layer is formed, therefore, metal ions of the upper electrode do not adhere to the surface of the photoelectric conversion layer, as compared with a case where no upper electrode protection film is provided. As a result, off-leakage current of the photoelectric conversion layer can be more surely decreased.

An imaging panel producing method according to one embodiment of the present invention is a method for producing an imaging panel that generates an image based on scintillation light that is obtained from X-rays transmitted through an object, and the producing method includes the steps of: forming a thin film transistor on a substrate having an insulating property; forming a first insulating film and a second insulating film on the thin film transistor; forming a first contact hole on the drain electrode of the thin film transistor so that the first contact hole passes through the first insulating film and the second insulating film; forming a first transparent electrode film on the second insulating film so that the first transparent electrode serves as a lower electrode that is connected with the drain electrode through the first contact hole; sequentially forming a first amorphous semiconductor layer having a first conductivity, an intrinsic amorphous semiconductor layer, and a second amorphous semiconductor layer having a second conductivity that is opposite to the first conductivity, so that these layers serve as a photoelectric conversion layer, on the first transparent electrode film; forming an upper electrode on the second amorphous semiconductor layer; forming resist so that the resist covers the upper electrode, and curing the resist with use of ultraviolet light; dry-etching the first amorphous semiconductor layer, the intrinsic amorphous semiconductor layer, and the second amorphous semiconductor layer in an area where the resist is not arranged, so as to form the photoelectric conversion layer in such a form that at least an upper end portion of the second amorphous semiconductor layer has a protrusion that protrudes toward an outer side with respect to an upper end portion of the intrinsic amorphous semiconductor layer; removing the resist, and forming a third insulating film so that the third insulating film covers the upper electrode; forming a second contact hole on the upper electrode so that the second contact hole passes through the third insulating film; forming a fourth insulating film on the third insulating film, in an area except for the second contact hole; forming a signal line for supplying a bias voltage, on the fourth insulating film; forming, on the fourth insulating film, a transparent conductive film for connecting the signal line and the upper electrode through the second contact hole; and forming a fifth insulating film so that the fifth insulating film covers the transparent conductive film (the third configuration).

According to the third configuration, after the resist is formed so as to cover the upper electrode, the resist is cured with ultraviolet light, and then, the first amorphous semiconductor layer, the intrinsic amorphous semiconductor layer, and the second amorphous semiconductor layer are dry-etched, whereby the photoelectric conversion layer is formed. By curing the resist, the shape of the resist is maintained, even if dry etching is carried out. In other words, the resist is not etched toward the inner side direction by dry etching, and side surfaces of the second amorphous semiconductor layer and the intrinsic amorphous semiconductor layer are etched, whereby the protrusion portion is formed. Here, the protrusion portion thus formed makes it unlikely that the interface between the second amorphous semiconductor layer and the intrinsic amorphous semiconductor layer would have plasma damage. In this way, the imaging panel in which off-leakage current of the photoelectric conversion layer is decreased can be produced.

The third configuration may be further characterized in that an etching rate for etching the second amorphous semiconductor layer in the dry-etching step is greater than an etching rate for etching the intrinsic amorphous semiconductor layer (the fourth configuration).

With the fourth configuration, the protrusion portion can be formed more surely, whereby off-leakage current of the photoelectric conversion layer can be decreased.

The third or fourth configuration may be further characterized in further including the step of forming an insulating film that serves as an upper electrode protection film on the second amorphous semiconductor layer so that the insulating film covers the upper electrode, after the step of forming the upper electrode, wherein the resist is formed on the upper electrode protection film (the fifth configuration).

According to the fifth configuration, the upper electrode is covered with the upper electrode protection film and the third insulating film. When resist used to form the photoelectric conversion layer is removed, therefore, metal ions of the upper electrode do not adhere to the photoelectric conversion layer. This makes it possible to more surely decrease off-leakage current of the photoelectric conversion layer.

The fifth configuration may be further characterized in further including the step of applying a reduction treatment to a surface of the photoelectric conversion layer, after the step of forming the photoelectric conversion layer, before the step of removing the resist (the sixth configuration).

With the sixth configuration, reaction products adhering to the surface of the photoelectric conversion layer in dry etching can be removed by a reduction treatment, which makes it possible to more surely decrease off-leakage current of the photoelectric conversion layer.

The following description describes embodiments of the present invention in detail, while referring to the drawings. Identical or equivalent parts in the drawings are denoted by the same reference numerals, and the descriptions of the same are not repeated.

Embodiment 1

(Configuration)

FIG. 1 is a schematic diagram illustrating an X-ray imaging device in the present embodiment. The X-ray imaging device 100 includes an imaging panel 1 and a control unit 2. The control unit 2 includes a gate control unit 2A and a signal reading unit 2B. X-rays are projected from the X-ray source 3 to an object S, and X-rays transmitted through the object S are converted into fluorescence (hereinafter referred to as scintillation light) by a scintillator 1A provided above the imaging panel 1. The X-ray imaging device 100 acquires an X-ray image by picking up the scintillation light with the imaging panel 1 and the control unit 2.

FIG. 2 is a schematic diagram illustrating a schematic configuration of the imaging panel 1. As shown in FIG. 2, a plurality of source lines 10, and a plurality of gate lines 11 intersecting with the source lines 10 are formed in the imaging panel 1. The gate lines 11 are connected with the gate control unit 2A, and the source lines 10 are connected with the signal reading unit 2B.

The imaging panel 1 includes TFTs 13 connected to the source lines 10 and the gate lines 11, at positions at which the source lines 10 and the gate lines 11 intersect. Further, photodiodes 12 are provided in areas surrounded by the source lines 10 and the gate lines 11 (hereinafter referred to as pixels). In each pixel, scintillation light obtained by converting X-rays transmitted through the object S is converted by the photodiode 12 into charges according to the amount of the light.

The gate lines 11 in the imaging panel 1 are sequentially switched by the gate control unit 2A into a selected state, and the TFT 13 connected to the gate line 11 in the selected state is turned ON. When the TFT 13 is turned ON, a signal according to the charges obtained by the conversion by the photodiode 12 is output through the source line 10 to the signal reading unit 2B.

FIG. 3 is an enlarged plan view of one pixel portion of the imaging panel 1 shown in FIG. 2. As shown in FIG. 3, in the pixel surrounded by the gate line 11 and the source line 10, a lower electrode 14a, a photoelectric conversion layer 15, and an upper electrode 14b that compose the photodiode 12 are arranged so as to overlap with one another. Further, a bias line 16 is arranged so as to overlap with the gate line 11 and the source line 10 when viewed in a plan view. The bias line 16 supplies a bias voltage to the photodiode 12. The TFT 13 includes a gate electrode 13a integrated with the gate line 11, a semiconductor activity layer 13b, a source electrode 13c integrated with the source line 10, and a drain electrode 13d. In the pixel, a contact hole CH1 for connecting the drain electrode 13d and the lower electrode 14a with each other is provided. Further, in the pixel, a transparent conductive film 17 is provided so as to overlap with the bias line 16, and the contact hole CH2 for connecting the transparent conductive film 17 and the upper electrode 14b with each other is provided.

Here, FIG. 4A shows a cross section of the pixel illustrated in FIG. 3, taken along line A-A. As shown in FIG. 4A, the TFT 13 is formed on the substrate 101. The substrate 101 is a substrate having an insulating property, which is formed with, for example, a glass substrate.

On the substrate 101, the gate electrode 13a integrated with the gate line 11 is formed. The gate electrode 13a and the gate line 11 are made of, for example, a metal such as aluminum (Al), tungsten (W), molybdenum (Mo), molybdenum nitride (MoN), tantalum (Ta), chromium (Cr), titanium (Ti), or copper (Cu), an alloy of any of these metals, or a metal nitride of these metals. In the present embodiment, the gate electrode 13a and the gate line 11 have a laminate structure in which a metal film made of molybdenum nitride and a metal film made of aluminum are laminated in this order. Regarding thicknesses of these metal films, for example, the metal film made of molybdenum nitride has a thickness of 100 nm, and the metal film made of aluminum has a thickness of 300 nm.

The gate insulating film 102 is formed on the substrate 101, and covers the gate electrode 13a. The gate insulating film 102 may be formed with, for example, silicon oxide ($SiO_x$), silicon nitride ($SiN_x$), silicon oxide nitride ($SiO_xN_y$) (x>y), or silicon nitride oxide ($SiN_xO_y$) (x>y). In the present embodiment, the gate insulating film 102 is formed with a laminate film obtained by laminating silicon oxide ($SiO_x$) and silicon nitride ($SiN_x$) in the order, and regarding the thicknesses of these films, the film of silicon oxide ($SiO_x$) has a thickness of 50 nm, and the film of silicon nitride ($SiN_x$) has a thickness of 400 nm.

The semiconductor activity layer 13b, as well as the source electrode 13c and the drain electrode 13d connected with the semiconductor activity layer 13b are formed on the gate electrode 13a with the gate insulating film 102 being interposed therebetween.

The semiconductor activity layer 13b is formed in contact with the gate insulating film 102. The semiconductor activity layer 13b is made of an oxide semiconductor. For forming the oxide semiconductor, for example, the following material may be used: $InGaO_3(ZnO)_5$; magnesium zinc oxide ($Mg_xZn_{1-x}O$); cadmium zinc oxide ($Cd_xZn_{1-x}O$); cadmium oxide (CdO); or an amorphous oxide semiconductor containing indium (In), gallium (Ga), and zinc (Zn) at a predetermined ratio. In the present embodiment, the semiconductor activity layer 13b is made of an amorphous oxide semiconductor containing indium (In), gallium (Ga), and zinc (Zn) at a predetermined ratio, and has a thickness of, for example, 70 nm.

The source electrode 13c and the drain electrode 13d are formed in contact with the semiconductor activity layer 13b and the gate insulating film 102. The source electrode 13c is integrated with the source line 10. The drain electrode 13d is connected with the lower electrode 14a through the contact hole CH1.

The source electrode 13c and the drain electrode 13d are formed in the same layer, and are made of, for example, a metal such as aluminum (Al), tungsten (W), molybdenum (Mo), tantalum (Ta), chromium (Cr), titanium (Ti), or copper (Cu), or alternatively, an alloy of any of these, of a metal nitride of any of these. Further, as the material for the source electrode 13c and the drain electrode 13d, the following material may be used: a material having translucency such as indium tin oxide (ITO), indium zinc oxide (IZO), indium tin oxide (ITSO) containing silicon oxide, indium oxide ($In_2O_3$), tin oxide ($SnO_2$), zinc oxide (ZnO), or titanium nitride; or a material obtained by appropriately combining any of these.

The source electrode 13c and the drain electrode 13d may be, for example, a laminate of a plurality of metal films. More specifically, the source electrode 13c, the source line 10, and the drain electrode 13d have a laminate structure in which a metal film made of molybdenum nitride (MoN), a metal film made of aluminum (Al), and a metal film made of molybdenum nitride (MoN) are laminated in this order. Regarding the thicknesses of the films, the metal film in the lower layer, which is made of molybdenum nitride (MoN), has a thickness of 100 nm, the metal film made of aluminum (Al) has a thickness of 500 nm, and the metal film in the upper layer, which is made of molybdenum nitride (MoN), has a thickness of 50 nm.

A first insulating film 103 is provided so as to cover the source electrode 13c and the drain electrode 13d. The first insulating film 103 may have a single layer structure made of silicon oxide ($SiO_2$) or silicon nitride (SiN), or a laminate structure obtained by laminating silicon nitride (SiN) and silicon oxide ($SiO_2$) in this order.

On the first insulating film 103, a second insulating film 104 is formed. The second insulating film 104 is made of an organic transparent resin, for example, acrylic resin or siloxane-based resin, has a thickness of, for example, 2.5 µm.

On the drain electrode 13d, the contact hole CH1 is formed, which passes through the second insulating film 104 and the first insulating film 103.

On the second insulating film 104, the lower electrode 14a, which is connected with the drain electrode 13d through the contact hole CH1, is formed. The lower electrode 14a is formed with, for example, a metal film containing molybdenum nitride (MoN), and has a thickness of, for example, 200 nm.

On the lower electrode 14a, the photoelectric conversion layer 15 is formed. The photoelectric conversion layer 15 is composed of the n-type amorphous semiconductor layer 151, the intrinsic amorphous semiconductor layer 152, and the p-type amorphous semiconductor layer 153, which are laminated in the order.

The n-type amorphous semiconductor layer 151 is made of amorphous silicon doped with an n-type impurity (for example, phosphorus). The n-type amorphous semiconductor layer 151 has a thickness of, for example, 30 nm.

The intrinsic amorphous semiconductor layer 152 is made of intrinsic amorphous silicon. The intrinsic amorphous semiconductor layer 152 is formed in contact with the n-type amorphous semiconductor layer 151. The intrinsic amorphous semiconductor layer has a thickness of, for example, 1000 nm.

The p-type amorphous semiconductor layer 153 is made of amorphous silicon doped with a p-type impurity (for example, boron). The p-type amorphous semiconductor layer 153 is formed in contact with the intrinsic amorphous semiconductor layer 152. The p-type amorphous semiconductor layer 153 has a thickness of, for example, 5 nm.

On the p-type amorphous semiconductor layer 153, the upper electrode 14b is formed. The upper electrode 14b is made of, for example, indium tin oxide (ITO), and has a thickness of, for example, 70 nm.

Figure 4B:
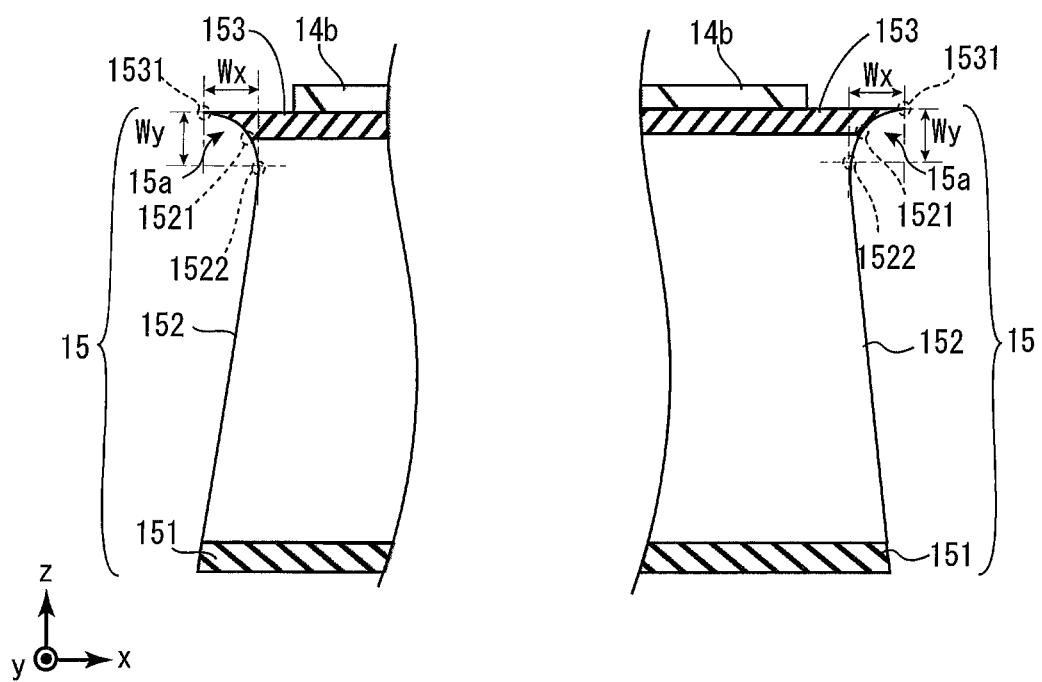
FIG. 4B is an enlarged cross-sectional view illustrating an end portion of the photoelectric conversion layer shown in FIG. 4A.

Here, FIG. 4B shows an enlarged view of end portions of the photoelectric conversion layer 15 and the upper electrode 14b shown in FIG. 4A. As shown in FIG. 4B, the p-type amorphous semiconductor layer 153 has an upper end portion 1531 in such an inversely tapered shape that it protrudes toward an outer side in the X-axis direction with respect to an upper end portion 1521 of the intrinsic amorphous semiconductor layer 152. Further, the intrinsic amorphous semiconductor layer 152 has a gradual tilt from the upper end portion 1521 to a point 1522 thereof at which the tilt is approximately perpendicular, thereby being tapered. In other words, the side surface in the vicinity of the boundary between the p-type amorphous semiconductor layer 153 and the intrinsic amorphous semiconductor layer 152 in the photoelectric conversion layer 15 is tilted with respect to the n-type amorphous semiconductor layer 151.

In the photoelectric conversion layer 15, a portion that includes at least a part of the upper end portion 1531 of the p-type amorphous semiconductor layer 153 protruding out with respect to the upper end portion 1521 of the intrinsic amorphous semiconductor layer 152 is referred to as a protrusion portion 15a. In the present embodiment, the protrusion portion 15a includes a part from the upper end portion 1531 of the p-type amorphous semiconductor layer 153 to the point 1522 in the intrinsic amorphous semiconductor layer 152. In other words, the width Wx in the X-axis direction and the width Wy in the Y-axis direction of the protrusion portion 15a are equal to the length in the X-axis direction and the length in the Y-axis direction of the part from the upper end portion 1531 of the p-type amorphous semiconductor layer 153 to the point 1522 of the intrinsic amorphous semiconductor layer 152, respectively. Each of the widths Wx and Wy of the protrusion portion 15a is preferably 10 nm to 150 nm.

Referring back to FIG. 4A, a third insulating film 105 is formed on the second insulating film 104 so as to cover the photodiode 12. The third insulating film 105 is, for example, an inorganic insulating film made of silicon nitride (SiN), and has a thickness of, for example, 300 nm.

In the third insulating film 105, the contact hole CH2 is formed at a position that overlaps with the upper electrode 14b.

On the third insulating film 105, in the area except for the contact hole CH2, a fourth insulating film 106 is formed. The fourth insulating film 106 is, for example, made of an organic transparent resin such as acrylic resin or siloxane-based resin, and has a thickness of, for example, 2.5 μm.

On the fourth insulating film 106, the bias line 16 is formed. Further, on the fourth insulating film 106, the transparent conductive film 17 is formed so as to overlap with the bias line 16. The transparent conductive film 17 is in contact with the upper electrode 14b in the contact hole CH2. The bias line 16 is connected with the control unit 2 (see FIG. 1). The bias line 16 applies a bias voltage that is input from the control unit 2 to the upper electrode 14b through the contact hole CH2. The bias line 16 has, for example, a laminate structure obtained by sequentially laminating a metal film made of molybdenum nitride (MoN), a metal film made of aluminum (Al), and a metal film made of titanium (Ti). The films of molybdenum nitride (MoN), aluminum (Al), and titanium (Ti) have thicknesses of, for example, 100 nm, 300 nm, and 50 nm, respectively.

On the fourth insulating film 106, a fifth insulating film 107 is formed so as to cover the transparent conductive film 17. The fifth insulating film 107 is, for example, an inorganic insulating film made of silicon nitride (SiN), and has a thickness of, for example, 200 nm.

On the fifth insulating film 107, a sixth insulating film 108 is formed. The sixth insulating film 108 is formed with an organic transparent resin made of, for example, acrylic resin or siloxane-based resin, and has a thickness of, for example, 2.0 μm.

(Method for Producing Imaging Panel 1)

Next, the following description describes a method for producing the imaging panel 1. FIGS. 5A to 5T are cross-sectional views of the pixel taken along line A-A in respective steps of the method for producing the imaging panel 1 (see FIG. 3).

As shown in FIG. 5A, the gate insulating film 102 and the TFT 13 are formed on the substrate 101 by a known method, and the first insulating film 103 made of silicon nitride (SiN) is formed by, for example, plasma CVD, so as to cover the TFT 13.

Subsequently, a heat treatment at about 350° C. is applied to an entire surface of the substrate 101, and photolithography and wet etching are carried out so that the first insulating film 103 is patterned, whereby the contact hole CH1 is formed on the drain electrode 13d (see FIG. 5B).

Next, the second insulating film 104 made of acrylic resin or siloxane-based resin is formed on the first insulating film 103 by, for example, slit coating (see FIG. 5C).

Figure 5D:
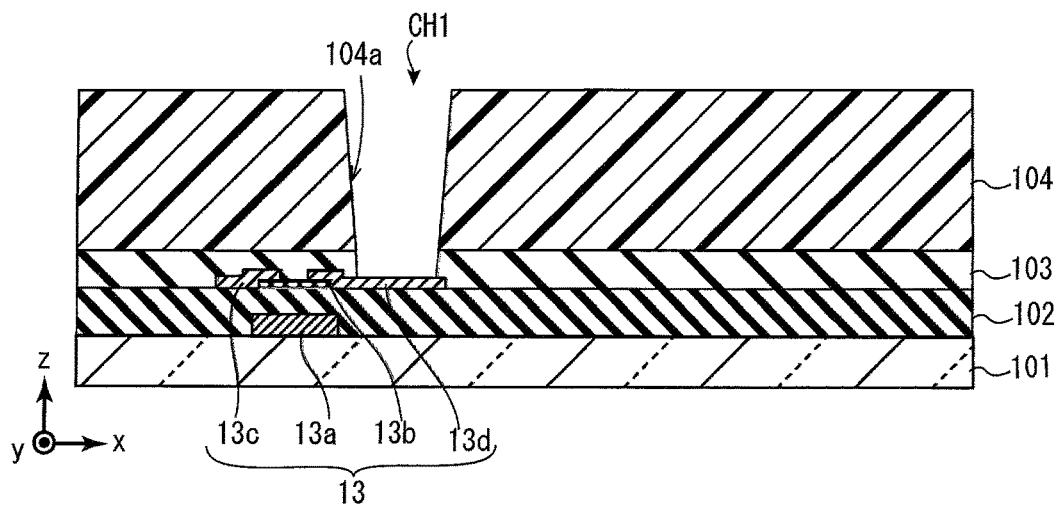
FIG. 5D is a cross-sectional view illustrating a step of forming an opening of the second insulating film on the contact hole CH1 shown in FIG. 5C.

An opening 104a of the second insulating film 104 is formed by photolithography so as to be on the contact hole CH1 (see FIG. 5D).

Figure 5E:
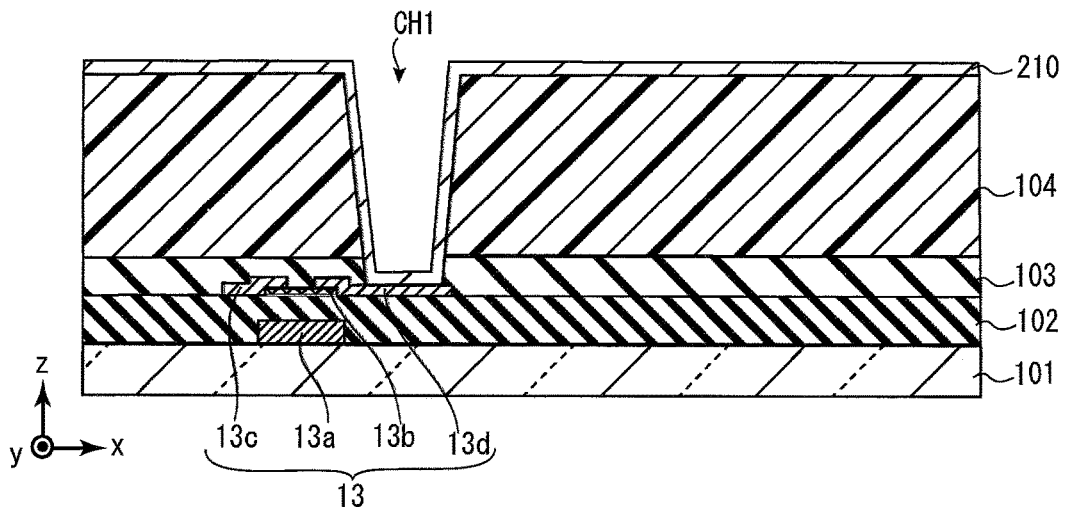
FIG. 5E is a cross-sectional view illustrating a step of forming a metal film on the second insulating film shown in FIG. 5D.

Subsequently, a metal film 210 made of molybdenum nitride (MoN) is formed on the second insulating film 104 by, for example, sputtering (see FIG. 5E).

Figure 5F:
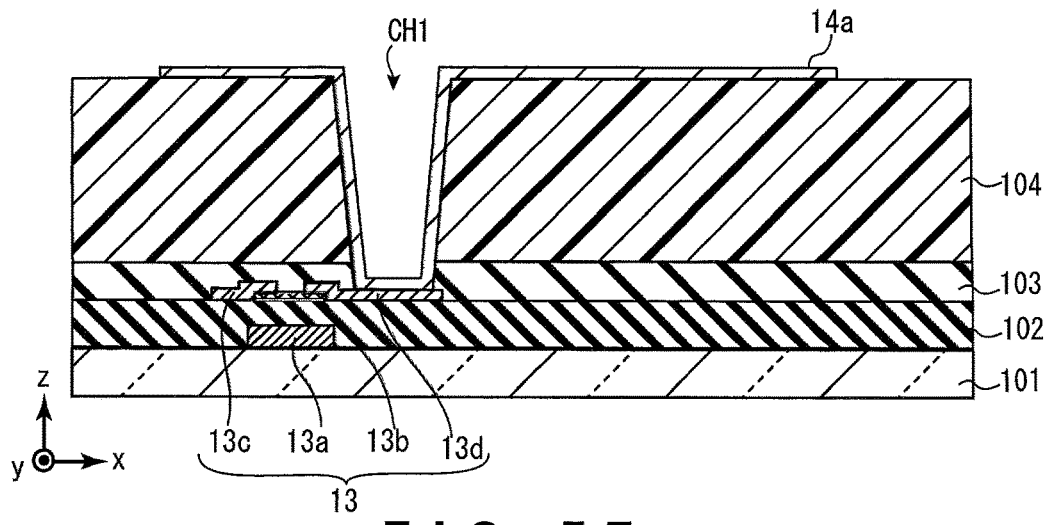
FIG. 5F is a cross-sectional view illustrating a step of patterning the metal film shown in FIG. 5E so as to form a lower electrode that is connected with the drain electrode through the contact hole CH1.

Then, photolithography and wet etching are carried out, whereby the metal film 210 is patterned. Through these steps, the lower electrode 14a, which is connected with the drain electrode 13d through the contact hole CH1, is formed on the second insulating film 104 (see FIG. 5F).

Next, the n-type amorphous semiconductor layer 151, the intrinsic amorphous semiconductor layer 152, and the p-type amorphous semiconductor layer 153 are formed in this order on the second insulating film 104 by, for example, plasma CVD, so as to cover the lower electrode 14a. Then, a transparent conductive film 220 made of, for example, ITO is formed on the p-type amorphous semiconductor layer 153 (see FIG. 5G).

Thereafter, photolithography and dry etching are carried out so that the transparent conductive film 220 is patterned, whereby the upper electrode 14b is formed on the p-type amorphous semiconductor layer 153 (see FIG. 5H).

Figure 5I:
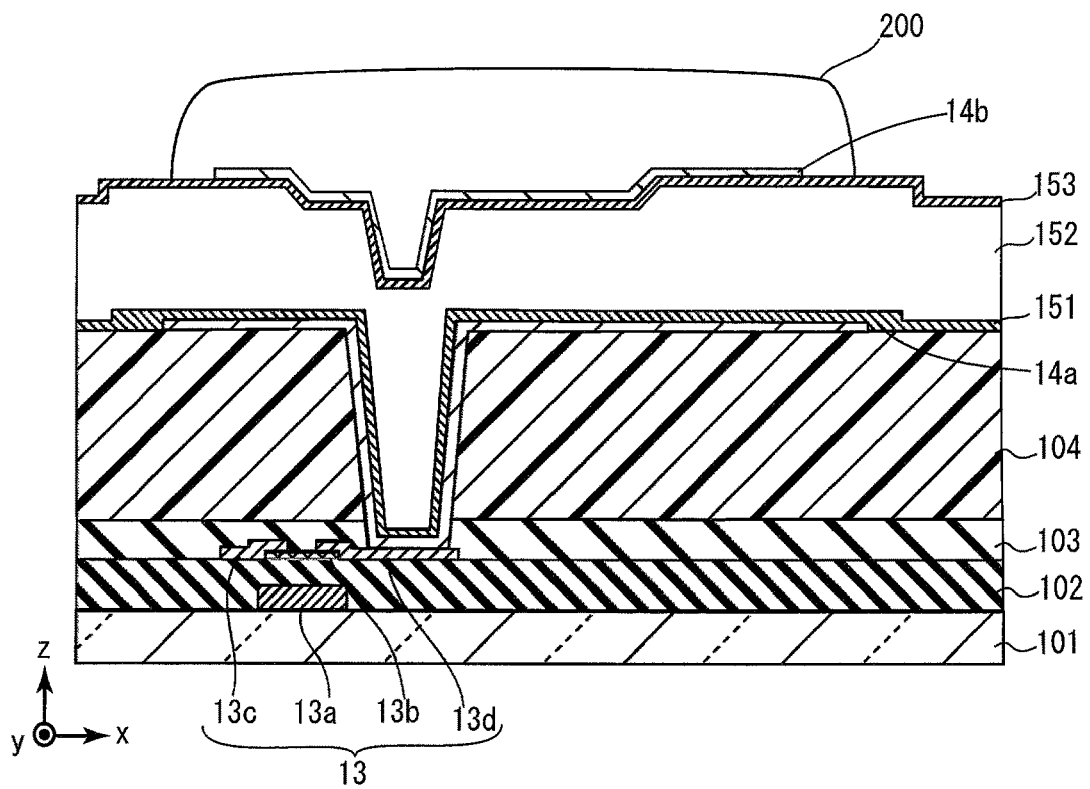
FIG. 5I is a cross-sectional view illustrating a step of forming resist on the p-type amorphous semiconductor layer shown in FIG. 5H so that the resist covers the upper electrode.

Subsequently, resist 200 is formed by using photolithography on the p-type amorphous semiconductor layer 153 so as to cover the upper electrode 14b (see FIG. 5I). More specifically, photosensitive resist is applied on the p-type amorphous semiconductor layer 153, and is exposed by using a photomask so that the resist in an area other than the area where the photodiode 15 is to be formed is removed with use of a developing solution. Thereafter, the remaining resist is subjected to an ultraviolet light curing (UV curing) treatment. Through these steps, the resist 200 is formed only on the part where the photodiode 15 is formed, of the p-type amorphous semiconductor layer 153. The resist 200 has a thickness of, for example, 1.5 μm to 2.5 μm. The edge of the resist 200 is steep with respect to the p-type amorphous semiconductor layer 153.

Figure 5J:
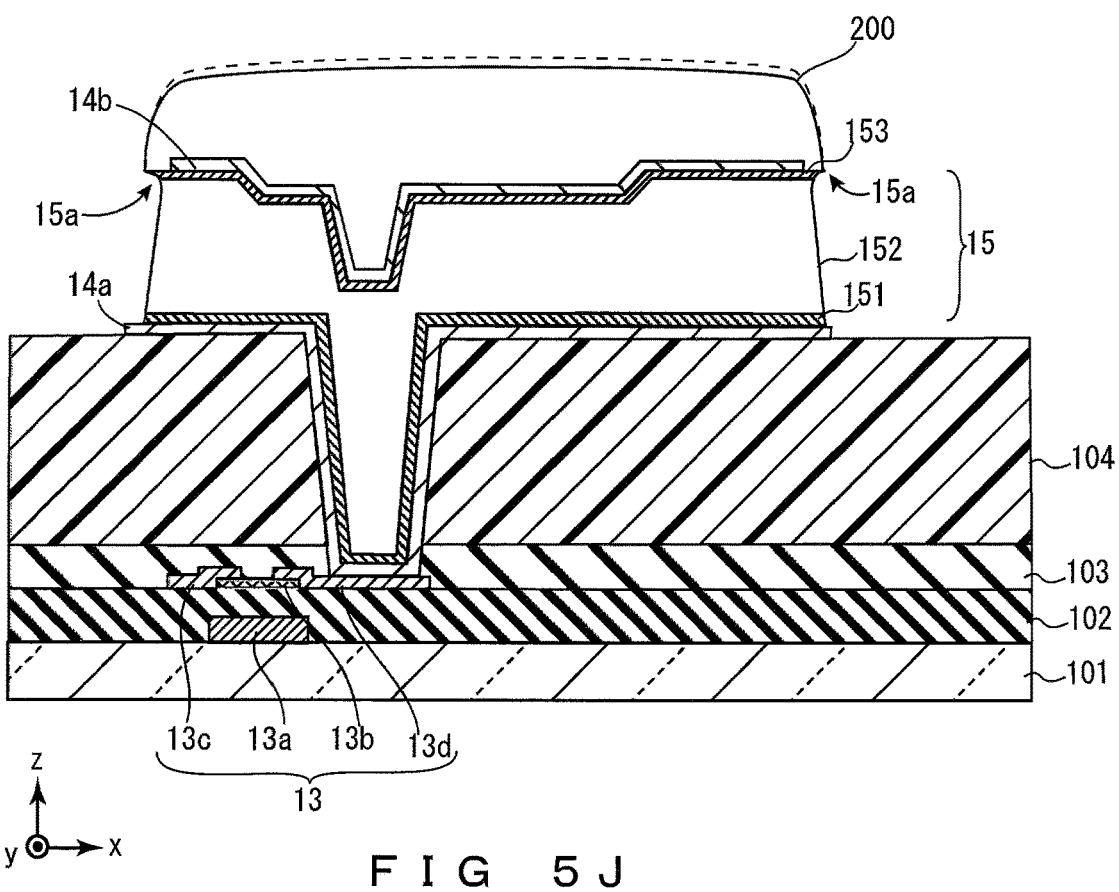
FIG. 5J is a cross-sectional view illustrating a step of patterning the n-type amorphous semiconductor layer, the intrinsic amorphous semiconductor layer, and the p-type amorphous semiconductor layer shown in FIG. 5I by dry etching.

Next, photolithography and dry etching are carried out so as to pattern the n-type amorphous semiconductor layer 151, the intrinsic amorphous semiconductor layer 152, and the p-type amorphous semiconductor layer 153 (see FIG. 5J).

As dry etching, for example, reactive ion etching (RIE) is carried out. As the etching gas, mixture gas containing fluorine-containing gas such as sulfur hexafluoride gas ($SF_6$) and chlorine-based gas such as hydrogen chloride (HCl) is used. Further, etching conditions are set so that the etching rate with respect to the p-type amorphous semiconductor layer 153 is greater than the etching rate with respect to the intrinsic amorphous semiconductor layer 152. More specifically, the flow rates of hexafluoride gas ($SF_6$) and hydrogen chloride (HCl) are set to 50 to 300 sccm, the pressure in the etching chamber is set to 10 to 60 Pa, and the high frequency power to be applied is set to 500 to 2000 W. Reactive ion etching is carried out under these etching conditions, whereby the parts not covered with the resist 200 of the p-type amorphous semiconductor layer 153, the intrinsic amorphous semiconductor layer 152, and the n-type amorphous semiconductor layer 151 are etched. As a result, the photoelectric conversion layer 15 is formed.

Here, the photoelectric conversion layer 15 has the protrusion portion 15a. The resist 200 has been subjected to the UV curing treatment, and reactive ion etching has excellent anisotropy. In reactive ion etching, the resist 200, therefore, is hardly etched in the X-axis direction, even though it is etched in the Y-axis direction and thereby has a reduced thickness. In other words, a state in which the edge of the resist 200 is steep with respect to the p-type amorphous semiconductor layer 153 is maintained. Through the above-described etching treatment, therefore, side surfaces of the p-type amorphous semiconductor layer 153 and the intrinsic amorphous semiconductor layer 152 are etched, whereby the p-type amorphous semiconductor layer 153 has such an inversely tapered shape that the upper end portion thereof protrudes toward the outer side with respect to the upper end portion of the intrinsic amorphous semiconductor layer 152. Thus, the intrinsic amorphous semiconductor layer 152 has a tapered shape. Plasma damage in reactive ion etching has more or less anisotropy, but the protrusion portion 15a thus formed makes it unlikely that the interface between the intrinsic amorphous semiconductor layer 152 and the p-type amorphous semiconductor layer 153 would have plasma damage.

Figure 5K:
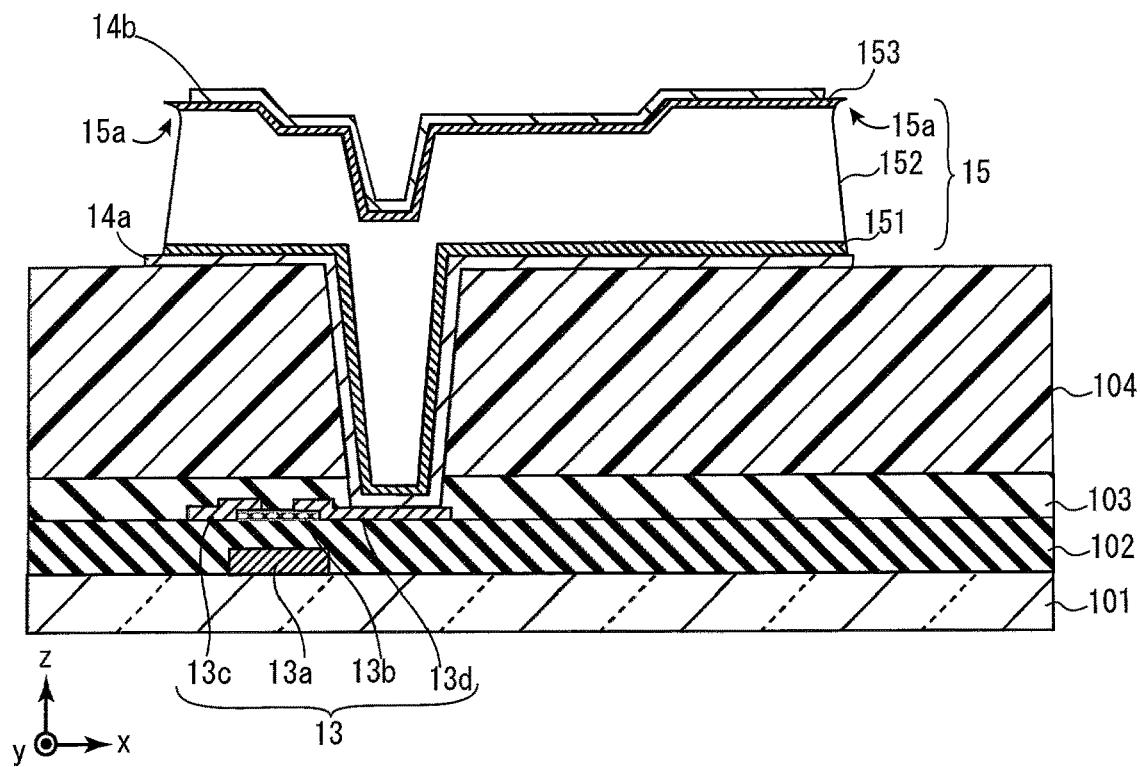
FIG. 5K is a cross-sectional view illustrating a state after removing the resist shown in FIG. 5J.

Then, after the p-type amorphous semiconductor layer 153, the intrinsic amorphous semiconductor layer 152, and the n-type amorphous semiconductor layer 151 are etched, the resist 200 is removed (see FIG. 5K).

Figure 5L:
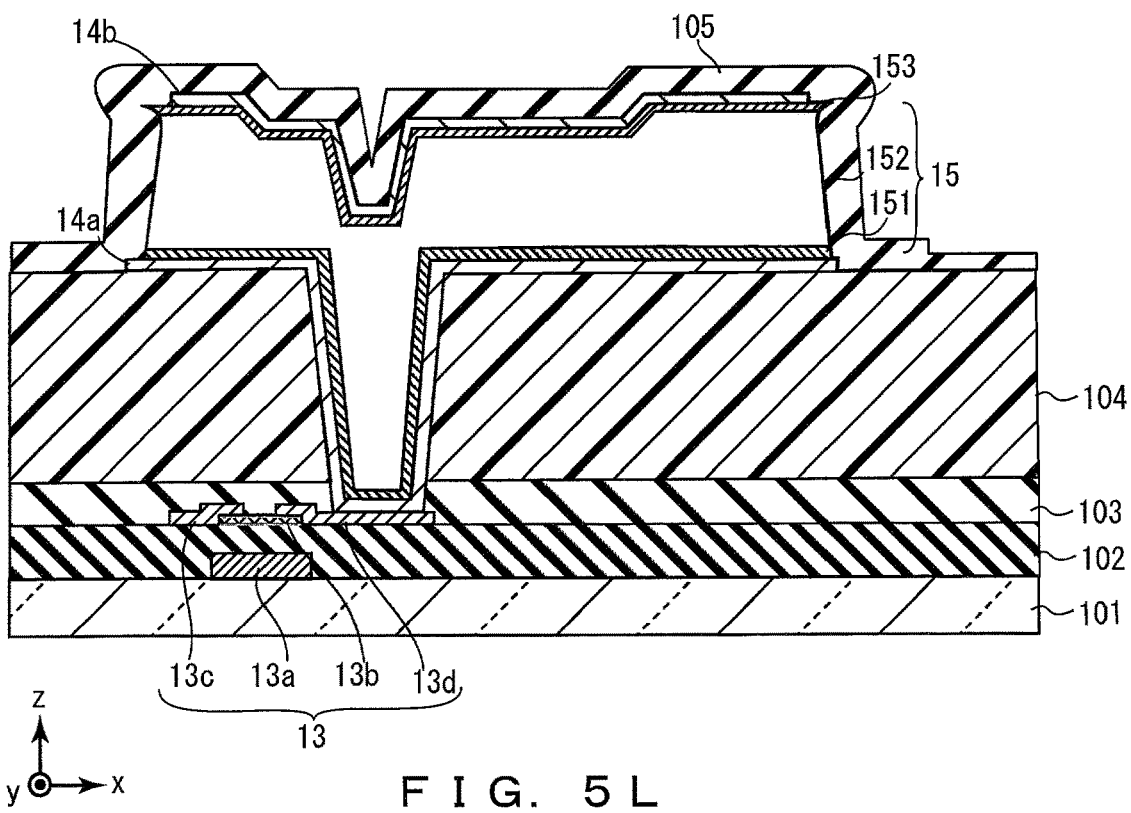
FIG. 5L is a cross-sectional view illustrating a step of forming a third insulating film so that the third insulating film covers the upper electrode shown in FIG. 5K.

Next, the third insulating film 105 made of silicon nitride (SiN) is formed so as to cover the upper electrode 14b, by, for example, plasma CVD (see FIG. 5L).

Then, photolithography and wet etching are carried out so as to form an opening 105a in the third insulating film 105 (see FIG. 5M).

Subsequently, the fourth insulating film 106 made of acrylic resin or siloxane-based resin is formed on the third insulating film 105 by, for example, slit coating. Then, an opening 106a of the fourth insulating film 106 is formed on the opening 105a by photolithography. Through these steps, the contact hole CH2 composed of the opening 105a of the third insulating film 105 and the opening 106a of the fourth insulating film 106 is formed (see FIG. 5N).

Next, a metal film 160 is formed by laminating molybdenum nitride (MoN), aluminum (Al), and titanium (Ti) in this order on the fourth insulating film 106 by, for example, sputtering (see FIG. 5O).

Figure 5P:
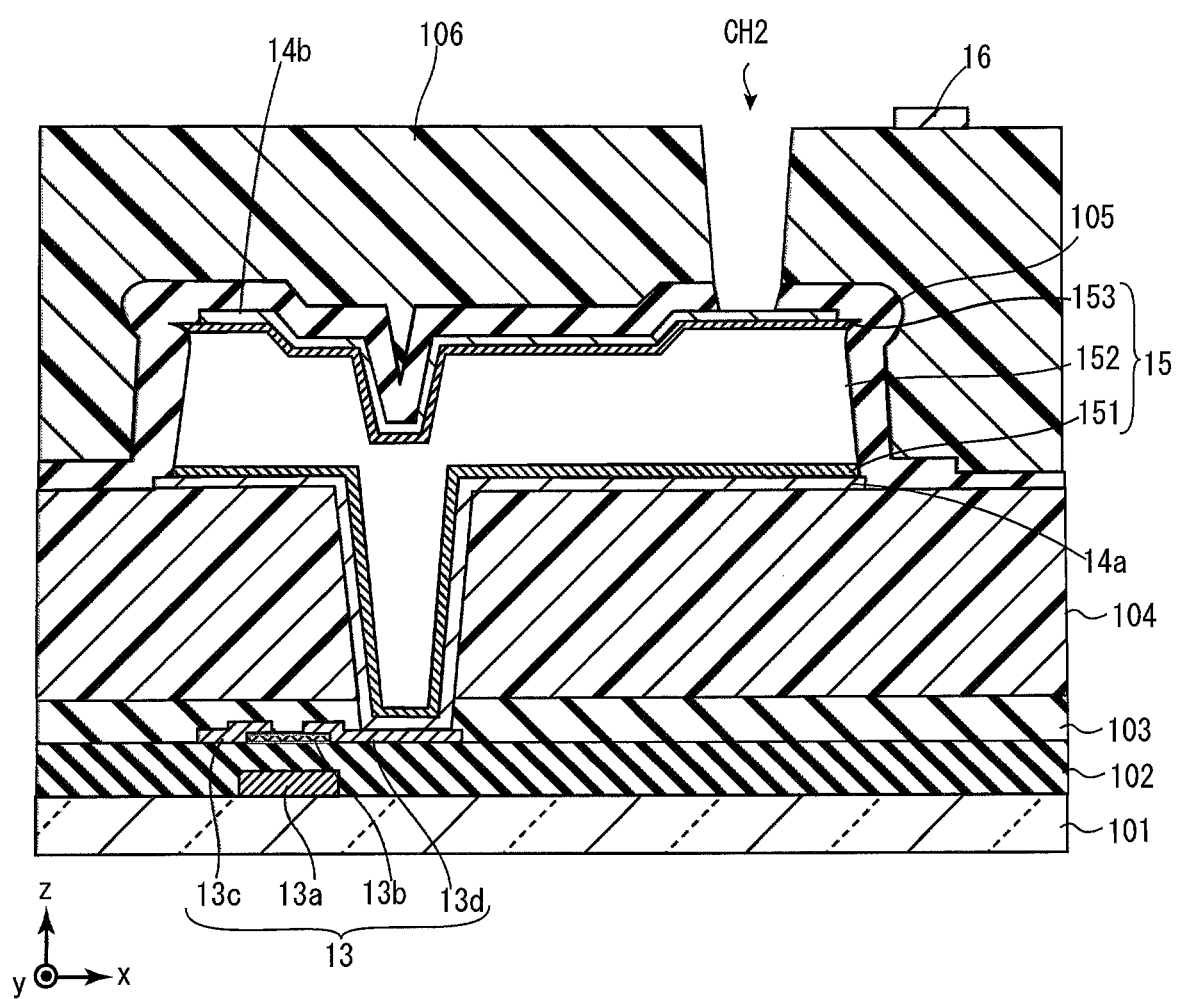
FIG. 5P is a cross-sectional view illustrating a step of forming a bias line by patterning the metal film shown in FIG. 5O.

Then, photolithography and wet etching are carried out so that the metal film 160 is patterned, whereby the bias line 16 is formed (see FIG. 5P).

Subsequently, a transparent conductive film 170 made of ITO is formed by, for example, sputtering on the fourth insulating film 106 so as to cover the bias line 16 (see FIG. 5O).

Figure 5R:
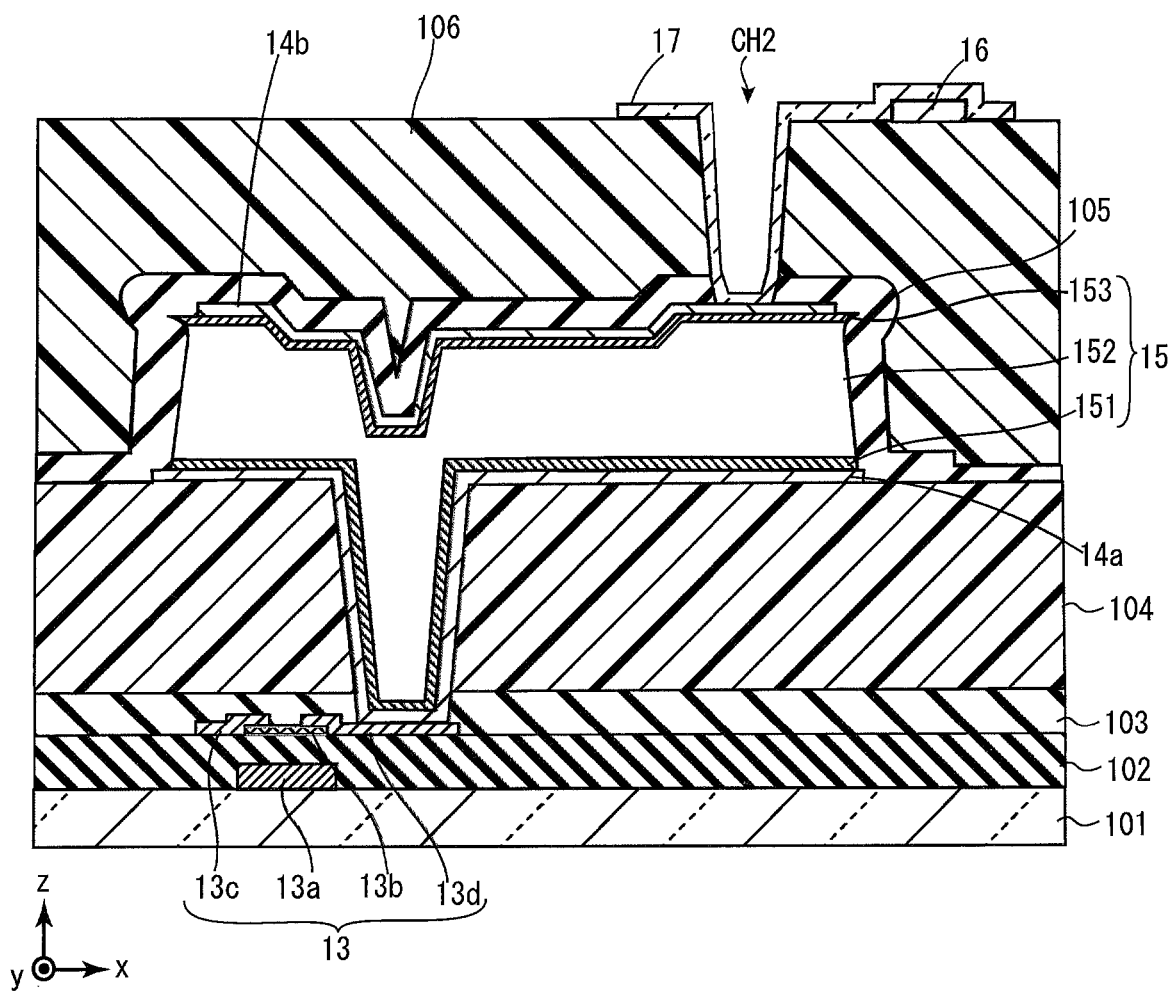
FIG. 5R is a cross-sectional view illustrating a step of patterning the transparent conductive film shown in FIG. 5Q.
Figure 5T:
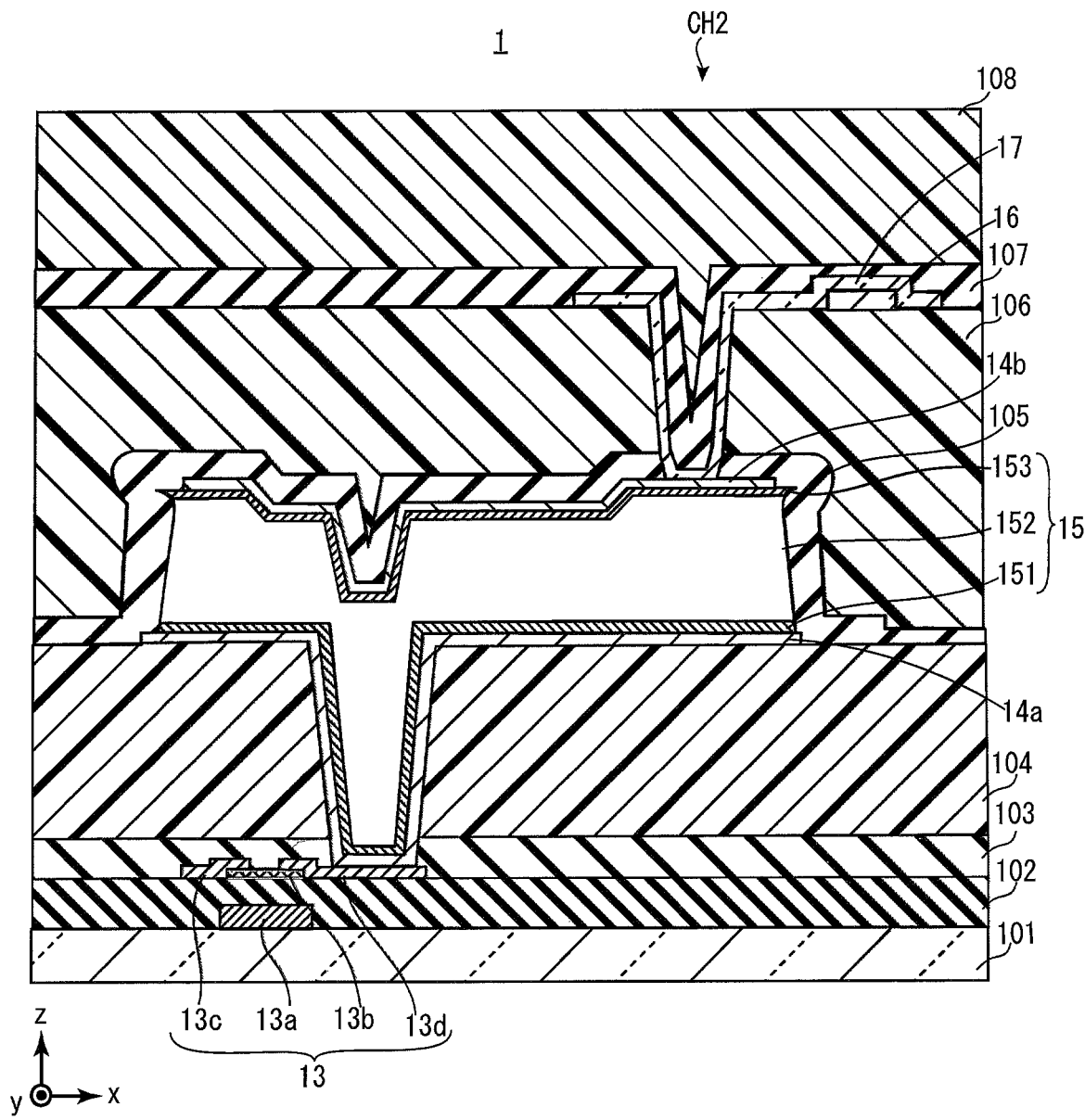
FIG. 5T is a cross-sectional view illustrating a step of forming a sixth insulating film on the fifth insulating film shown in FIG. 5S.

Then, photolithography and dry etching are carried out so that the transparent conductive film 170 is patterned, whereby the transparent conductive film 17 is formed that is connected with the bias line 16 and is connected with the upper electrode 14b through the contact hole CH2 (see FIG. 5R).

Next, the fifth insulating film 107 made of silicon nitride (SiN) is formed by, for example, plasma CVD on the fourth insulating film 106 so as to cover the transparent conductive film 17 (see FIG. 5S).

Subsequently, the sixth insulating film 108 made of acrylic resin or siloxane-based resin is formed on the fifth insulating film 107 by, for example, slit coating (see FIG. 5T).

The method described above is the method for producing the imaging panel 1 in the present embodiment. As described above, the resist 200 formed on the p-type amorphous semiconductor layer 153 is subjected to the UV curing treatment, and the edge of the resist 200 is steep with respect to the p-type amorphous semiconductor layer 153. Further, reactive ion etching is carried out in such a manner that the etching rate with respect to the p-type amorphous semiconductor layer 153 is greater than the etching rate with respect to the intrinsic amorphous semiconductor layer 152. As a result, the protrusion portion 15a in which the upper end portion of the p-type amorphous semiconductor layer 153 protrudes toward the outer side with respect to the upper end portion of the intrinsic amorphous semiconductor layer 152 is formed. The protrusion portion 15a thus formed makes it unlikely that the interface between the intrinsic amorphous semiconductor layer 152 and the p-type amorphous semiconductor layer 153 would have plasma damage, whereby leakage current of the photoelectric conversion layer 15 can be decreased.

Incidentally, the embodiment may be, for example, as follows: the intrinsic amorphous semiconductor layer 152 is not in a tapered shape, and the protrusion portion 15a is formed with only a part of the intrinsic amorphous semiconductor layer 152. In other words, the tilt of the side surface in the vicinity of the boundary between the intrinsic amorphous semiconductor layer 152 and the p-type amorphous semiconductor layer 153 in the photoelectric conversion layer 15 is approximately perpendicular with respect to the n-type amorphous semiconductor layer 151. In this case, the protrusion portion 15a is formed with only a part of the p-type amorphous semiconductor layer 153, and as compared with a case where there is no protrusion portion 15a, the possibility that the interface between the p-type amorphous semiconductor layer 153 and the intrinsic amorphous semiconductor layer 152 would have plasma damage is smaller. On the other hand, in this case, since the tilt of the side surface in the vicinity of the boundary between the p-type amorphous semiconductor layer 153 and the intrinsic amorphous semiconductor layer 152 in the photoelectric conversion layer 15 is approximately perpendicular with respect to the n-type amorphous semiconductor layer 151, the possibility that the interface between the p-type amorphous semiconductor layer 153 and the intrinsic amorphous semiconductor layer 152 would have plasma damage, as compared with the above-described embodiment.

(Operation of X-Ray Imaging Device 100)

Here, operations of the X-ray imaging device 100 illustrated in FIG. 1 are described. First, X-rays are emitted from the X-ray source 3. Here, the control unit 2 applies a predetermined voltage (bias voltage) to the bias line 16 (see FIG. 3 and the like). X-rays emitted from the X-ray source 3 transmit an object S, and are incident on the scintillator 1A. The X-rays incident on the scintillator 1A are converted into fluorescence (scintillation light), and the scintillation light is incident on the imaging panel 1. When the scintillation light is incident on the photodiode 12 provided in each pixel in the imaging panel 1, the scintillation light is changed to charges by the photodiode 12 in accordance with the amount of the light. A signal according to the charges obtained by conversion by the photodiode 12 is read out through the source line 10 to the signal reading unit 2B (see FIG. 2 and the like) when the TFT 13 (see FIG. 3 and the like) is in the ON state according to a gate voltage (positive voltage) that is output from the gate control unit 2A through the gate line 11. Then, an X-ray image in accordance with the signal thus read out is generated in the control unit 2.

Embodiment 2

FIG. 6 schematically shows a cross section of an imaging panel in Embodiment 2. In FIG. 6, the same configurations as those in Embodiment 1 are denoted by the same reference symbols as those in Embodiment 1. The following description principally describes configurations different from those in Embodiment 1.

As shown in FIG. 6, in an imaging panel 1' in the present embodiment, an insulating film 18 (hereinafter referred to as an upper electrode protection film) is formed so as to cover the p-type amorphous semiconductor layer 153 and the upper electrode 14b. The upper electrode protection film 18 is, for example, an inorganic insulating film made of silicon oxide ($SiO_2$), and has a thickness of, for example, 100 nm.

The third insulating film 105 is formed on the second insulating film 104 so as to cover the upper electrode protection film 18 and the photodiode 12.

The process for producing the imaging panel 1' is as follows. After the above-described steps shown in FIGS. 5A to 5H are carried out, an insulating film 180 made of silicon nitride (SiN) is formed by, for example, plasma CVD so as to cover the upper electrode 14b. Thereafter, the same step as the above-described step shown in FIG. 5I is carried out, whereby the resist 200 is formed on the insulating film 180 (see FIG. 7A).

Subsequently, the same step as the above-described step shown in FIG. 5J is carried out. Through these steps, the insulating film 180, the p-type amorphous semiconductor layer 153, the intrinsic amorphous semiconductor layer 152, and the n-type amorphous semiconductor layer 151 are etched (see FIG. 7B).

Then, the resist 200 is removed, whereby the upper electrode protection film 18, and the photoelectric conversion layer 15 in which the protrusion portion 15a is formed, are formed (see FIG. 7C). After the upper electrode protection film 18 and the photoelectric conversion layer 15 are formed, the steps shown in FIGS. 5L to 5T are carried out in the same way.

In the present embodiment as well, the photoelectric conversion layer 15 includes the protrusion portion 15a, as is the case with Embodiment 1 described above. Further, the top surface of the upper electrode 14b is covered with the upper electrode protection film 18, and the side surface of the upper electrode 14b is covered with the third insulating film 105, whereby the upper electrode 14b is not to be exposed to the removing solution that is used for removing the resist 200. As a result, metal ions of the upper electrode 14b do not adhere to the surface of the photoelectric conversion layer 15, which makes it possible to more surely decrease off-leakage current of the photoelectric conversion layer 15.

Embodiment 3

In Embodiment 2 described above, a reduction treatment using hydrogen fluoride may be further applied to the surfaces of the upper electrode protection film 18 and the photoelectric conversion layer 15.

Figure 8:
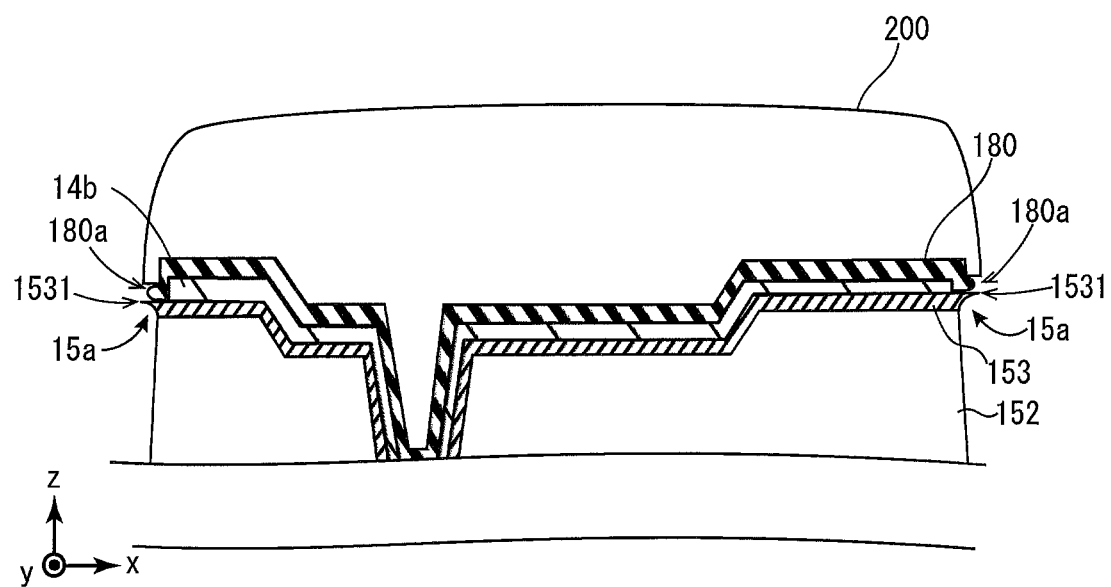
FIG. 8 is a cross-sectional view illustrating a step in a process for producing an imaging panel in Embodiment 3, which illustrates a state obtained by performing a reduction treatment after the n-type amorphous semiconductor layer, the intrinsic amorphous semiconductor layer, and the p-type amorphous semiconductor layer are patterned by dry etching.

In other words, after the above-described step shown in FIG. 7B, a reduction treatment using hydrogen fluoride is applied to the surfaces of the upper electrode protection film 18 and the photoelectric conversion layer 15. Through this step, as shown in FIG. 8, a side end portion 180a of the insulating film 180 is etched in the X-axis direction, thereby being positioned on an inner side with respect to the upper end portion 1531 of the p-type amorphous semiconductor layer 153.

During reactive ion etching, reaction products adhere to the side surface of the photoelectric conversion layer 15. By carrying out a reduction treatment using hydrogen fluoride after reactive ion etching, the reaction products can be removed. As a result, off-leakage current of the photoelectric conversion layer 15 can be more surely decreased.

The embodiments of the present invention, described above, are merely examples for implementing the present invention. The present invention, therefore, is not limited to the above-described embodiments, but can be appropriately modified without deviating from the scope of the invention and be implemented. The following description describes modifications of the present invention.

(1) Embodiments 2 to 3 are described above with reference to an exemplary case where silicon nitride (SiN) is used as a material for the upper electrode protection film 18, but silicon oxide ($SiO_2$) may be replaced with silicon nitride (SiN), or alternatively, silicon oxide nitride (SiON) may be used.

Silicon nitride (SiN), silicon oxide ($SiO_2$), and silicon oxide nitride (SiON) provide different adhesion properties with the upper electrode 14b, respectively, when they are used for forming the upper electrode protection film 18. More specifically, the respective adhesion properties with the upper electrode 14b of silicon nitride (SiN), silicon oxide ($SiO_2$), and silicon oxide nitride (SiON) descend in this order. In a case where the adhesiveness with the upper electrode 14b is taken into consideration, therefore, it is preferable to use silicon nitride (SiN) as a material for the upper electrode protection film 18.

The invention claimed is:

1. An imaging panel producing method for producing an imaging panel that generates an image based on scintillation light that is obtained from X-rays transmitted through an object, the producing method comprising the steps of:
    forming a thin film transistor on a substrate having an insulating property;
    forming a first insulating film and a second insulating film on the thin film transistor;
    forming a first contact hole on the drain electrode of the thin film transistor so that the first contact hole passes through the first insulating film and the second insulating film;
    forming a first transparent electrode film on the second insulating film so that the first transparent electrode serves as a lower electrode that is connected with the drain electrode through the first contact hole;
    sequentially forming a first amorphous semiconductor layer having a first conductivity, an intrinsic amorphous semiconductor layer, and a second amorphous semiconductor layer having a second conductivity that is opposite to the first conductivity, so that these layers serve as a photoelectric conversion layer, on the first transparent electrode film;
    forming an upper electrode on the second amorphous semiconductor layer;
    forming resist so that the resist covers the upper electrode, and curing the resist with use of ultraviolet light;
    dry-etching the first amorphous semiconductor layer, the intrinsic amorphous semiconductor layer, and the second amorphous semiconductor layer in an area where the resist is not arranged, so as to form the photoelectric conversion layer in such a form that an upper end portion of the second amorphous semiconductor layer has a protrusion that protrudes toward an outer side with respect to an upper end portion of the intrinsic amorphous semiconductor layer;

removing the resist, and forming a third insulating film so that the third insulating film covers the upper electrode;

forming a second contact hole on the upper electrode so that the second contact hole passes through the third insulating film;

forming a fourth insulating film on the third insulating film, in an area except for the second contact hole;

forming a signal line for supplying a bias voltage, on the fourth insulating film;

forming, on the fourth insulating film, a transparent conductive film for connecting the signal line and the upper electrode through the second contact hole; and forming a fifth insulating film so that the fifth insulating film covers the transparent conductive film.

2. The imaging panel producing method according to claim 1,
wherein an etching rate for etching the second amorphous semiconductor layer in the dry-etching step is greater than an etching rate for etching the intrinsic amorphous semiconductor layer.

3. The imaging panel producing method according to claim 1, further comprising the step of forming an insulating film that serves as an upper electrode protection film on the second amorphous semiconductor layer so that the insulating film covers the upper electrode, after the step of forming the upper electrode,
wherein the resist is formed on the upper electrode protection film.

4. The imaging panel producing method according to claim 3, further comprising the step of applying a reduction treatment to a surface of the photoelectric conversion layer, after the step of forming the photoelectric conversion layer, before the step of removing the resist.

* * * * *